(12) United States Patent
Kim et al.

(10) Patent No.: US 11,087,844 B2
(45) Date of Patent: Aug. 10, 2021

(54) NON-VOLATILE MEMORY DEVICE

(71) Applicant: SAMSUNG ELECTRONICS CO., LTD., Suwon-si (KR)

(72) Inventors: Chanho Kim, Seoul (KR); Kyunghwa Yun, Hwaseong-si (KR); Daeseok Byeon, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/944,312

(22) Filed: Jul. 31, 2020

(65) Prior Publication Data
US 2021/0065799 A1 Mar. 4, 2021

Related U.S. Application Data

(63) Continuation-in-part of application No. 16/863,736, filed on Apr. 30, 2020.

(30) Foreign Application Priority Data
Sep. 2, 2019 (KR) .................. 10-2019-0108469

(51) Int. Cl.
*G11C 16/04* (2006.01)
*G11C 16/10* (2006.01)
*G11C 16/26* (2006.01)
*G11C 16/08* (2006.01)

(52) U.S. Cl.
CPC ...... *G11C 16/0466* (2013.01); *G11C 16/0433* (2013.01); *G11C 16/08* (2013.01); *G11C 16/10* (2013.01); *G11C 16/26* (2013.01)

(58) Field of Classification Search
CPC . G11C 16/0466; G11C 16/0433; G11C 16/10; G11C 16/26; G11C 16/08
USPC ........................................... 365/182, 185.24
See application file for complete search history.

(56) References Cited

U.S. PATENT DOCUMENTS

| 9,129,681 | B2   | 9/2015  | Rabkin et al. |              |
|-----------|------|---------|---------------|--------------|
| 9,343,152 | B2 * | 5/2016  | Rhie          | G11C 16/0483 |
| 9,929,166 | B1   | 3/2018  | Sakuma et al. |              |
| 10,134,756| B2   | 11/2018 | Shim et al.   |              |
| 10,141,326| B1   | 11/2018 | Oh et al.     |              |
| 10,170,490| B2   | 1/2019  | Tanzawa       |              |
| 10,283,452| B2   | 5/2019  | Zhu et al.    |              |
| 2011/0104869 | A1 * | 5/2011 | Hyun ............... | H01L 27/11575 438/430 |
| 2011/0244666 | A1 * | 10/2011 | Kim ................. | H01L 27/11551 438/478 |

(Continued)

*Primary Examiner* — Michael T Tran
(74) *Attorney, Agent, or Firm* — Myers Bigel, P.A.

(57) ABSTRACT

A non-volatile memory device includes a memory cell region including a first metal pad and a memory cell array including a plurality of memory cells, and a peripheral circuit region including a second metal pad and vertically connected to the memory cell region. The memory cell region includes a plurality of word lines, a ground selection line in a layer on the word lines, a common source line in a layer on the ground selection line, a plurality of vertical pass transistors in the stair area, and a plurality of driving signal lines in the same layer as the common source line. The word lines form a stair shape in the stair area, and each of the vertical pass transistors is connected between a corresponding one of the word lines and a corresponding one of the driving signal lines.

20 Claims, 18 Drawing Sheets

(56) References Cited

U.S. PATENT DOCUMENTS

| | | | |
|---|---|---|---|
| 2013/0335248 A1* | 12/2013 | Iadanza | H03M 1/785 |
| | | | 341/154 |
| 2016/0268304 A1 | 9/2016 | Ikeda et al. | |
| 2018/0130821 A1 | 5/2018 | Son et al. | |
| 2019/0115361 A1* | 4/2019 | Kim | G11C 16/0483 |
| 2019/0244933 A1* | 8/2019 | Or-Bach | G11C 11/5628 |
| 2020/0013791 A1* | 1/2020 | Or-Bach | H01L 29/40117 |
| 2021/0104551 A1* | 4/2021 | Lin | H01L 27/11807 |

* cited by examiner

FIG. 6

|  | PROGRAM | READ | ERASE |
|---|---|---|---|
| Sla (WLsel) | Vpgm (e.g., 20V) | Vr (e.g., 0V) | Ver (e.g., 0V) |
| Slb (WLunsel) | Vpass (e.g., 9V) | Vread (e.g., 6V) | |

NON-VOLATILE MEMORY DEVICE

CROSS-REFERENCE TO RELATED APPLICATION

This application is a continuation-in-part of U.S. application Ser. No. 16/863,736, filed on Apr. 30, 2020, which claims the benefit of Korean Patent Application No. 10-2019-0108469, filed on Sep. 2, 2019, in the Korean Intellectual Property Office, the disclosure of each of which is incorporated herein in its entirety by reference.

BACKGROUND

The inventive concept relates to a memory device, and more particularly, to a non-volatile memory device having a cell over periphery (COP) structure.

With the recent multifunctionalization of information and communication devices, memory devices are desired to have a high capacity and a high integration density. With the reduction of memory cell size for high integration density, operating circuits and/or an interconnection structure, which are included in a memory device for the operation and electrical connection of the memory device, are becoming complex. Therefore, a memory device having high integration density and excellent electrical characteristics is desired. In particular, to increase the integration density of a memory device, the number of word lines stacked on a substrate in a vertical direction may be increased. The number of pass transistors connected to word lines may increase, thereby increasing a chip size.

SUMMARY

The inventive concept provides a non-volatile memory device for increasing an integration density thereof and decreasing a chip size thereof.

According to some embodiments of the inventive concept, there is provided a non-volatile memory device including a memory cell region including a first metal pad and a memory cell array including a plurality of memory cells, and a peripheral circuit region including a second metal pad and vertically connected to the memory cell region by the first metal pad and the second metal pad. The memory cell region may include a plurality of word lines stacked in the vertical direction that is perpendicular to the memory cell region. The memory cell region includes a ground selection line in a layer on the plurality of word lines, a common source line in a layer on the ground selection line, a plurality of vertical pass transistors in the stair area, and a plurality of driving signal lines in the same layer as the common source line. The plurality of word lines may form a stair shape in the stair area, and each of the plurality of vertical pass transistors may be connected between a corresponding word line among the plurality of word lines and a corresponding driving signal line among the plurality of driving signal lines.

According to some embodiments of the inventive concept, there is provided a non-volatile memory device including a memory cell region including a first metal pad and a memory cell array including a vertical channel structure, and a peripheral circuit region including a second metal pad and vertically connected to the memory cell region by the first metal pad and the second metal pad. The memory cell region may include a plurality of word lines stacked in the vertical direction that is perpendicular to the memory cell region, a ground selection line in a layer on the plurality of word lines, a plurality of vertical pass transistors in a stair area of the plurality of word lines. The plurality of vertical pass transistors each include a vertical channel extending in the vertical direction. The memory cell region may include a plurality of driving signal lines in a layer on the plurality of vertical pass transistors. Each of the plurality of vertical pass transistors may be connected between a corresponding word line among the plurality of word lines and a corresponding driving signal line among the plurality of driving signal lines.

According to some embodiments of the inventive concept, there is provided a non-volatile memory device including a memory cell region including a first metal pad and a memory cell array including a plurality of memory cells, and a peripheral circuit region including a second metal pad and vertically connected to the memory cell region by the first metal pad and the second metal pad. The peripheral circuit region includes a transistor. The memory cell region may include a plurality of word lines stacked in the vertical direction, a ground selection line in a layer on the plurality of word lines, a common source line in a layer on the ground selection line, a plurality of vertical pass transistors in a stair area of the plurality of word lines. The plurality of vertical pass transistors are respectively connected to the plurality of word lines. The memory cell region includes a plurality of first contacts extending in the vertical direction, connecting the plurality of vertical pass transistors to the plurality of word lines, and having same lengths in the vertical direction. The memory cell region includes a plurality of driving signal lines in the same layer as the common source line. Each of the plurality of vertical pass transistors may be connected between a corresponding driving signal line among the plurality of driving signal lines and a corresponding word line among the plurality of word lines and may include a gate that is configured to receive a block selection signal. The gate may be in the same layer as the ground selection line and may be connected to the transistor in the peripheral circuit region through a second contact and a first bonding pad that are formed in the memory cell region and through a second bonding pad and a third contact that are formed in the peripheral circuit region.

BRIEF DESCRIPTION OF THE DRAWINGS

Embodiments of the inventive concept will be more clearly understood from the following detailed description taken in conjunction with the accompanying drawings in which:

FIG. 6 is a table of voltages applied to a word line driving signal line in each memory operation, according to some embodiments;

DETAILED DESCRIPTION

Hereinafter, embodiments will be described in detail with reference to the accompanying drawings.

Figure 1:
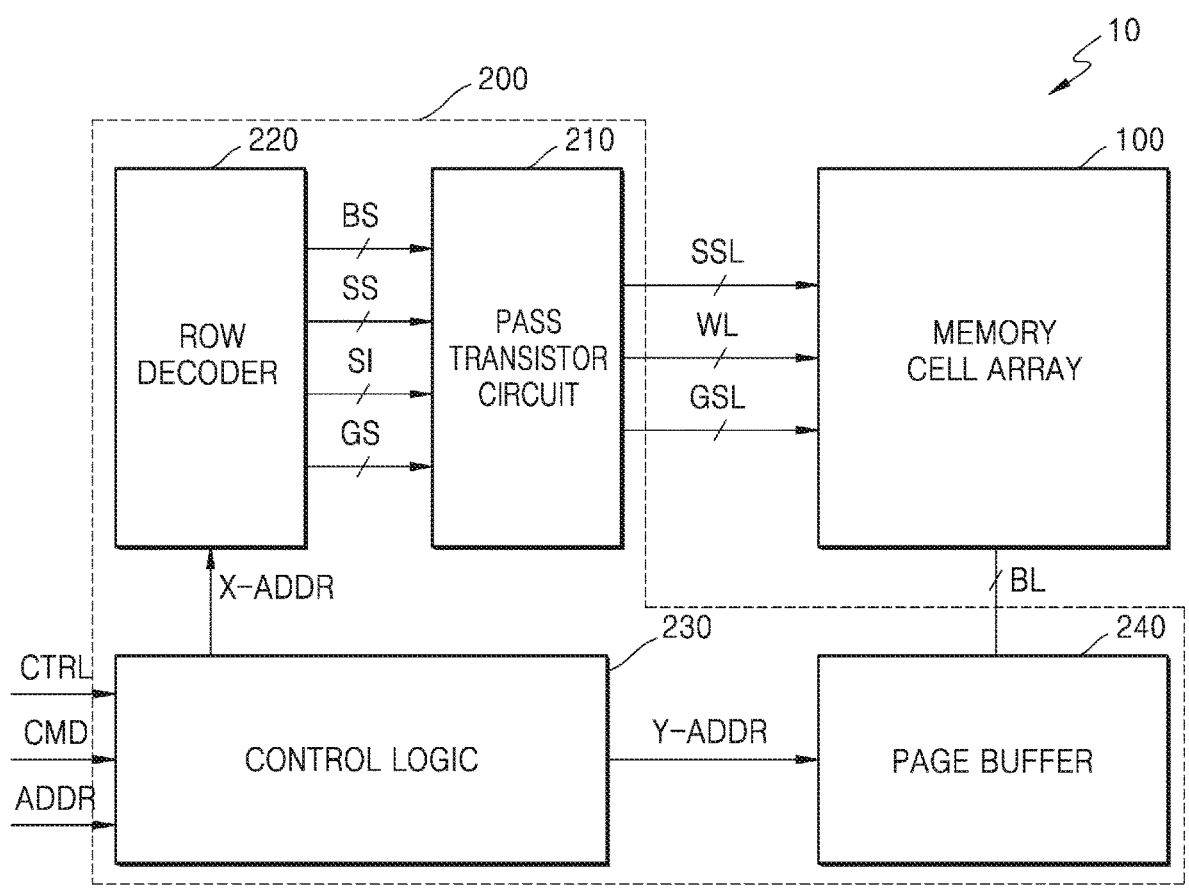
FIG. 1 is a block diagram of a memory device according to some embodiments.

FIG. 1 is a block diagram of a memory device 10 according to some embodiments.

Referring to FIG. 1, the memory device 10 may include a memory cell array 100 and a peripheral circuit 200. The peripheral circuit 200 may include a pass transistor circuit 210, a row decoder 220, a control logic 230, and a page buffer 240. Although not shown, the peripheral circuit 200 may further include a voltage generator, a data input/output (I/O) circuit, an I/O interface, column logic, a pre-decoder, a temperature sensor, a command decoder, and/or an address decoder. In some embodiments, the memory device 10 may be a non-volatile memory device. Hereinafter, the term "memory device" refers to a non-volatile memory device.

Figure 2:
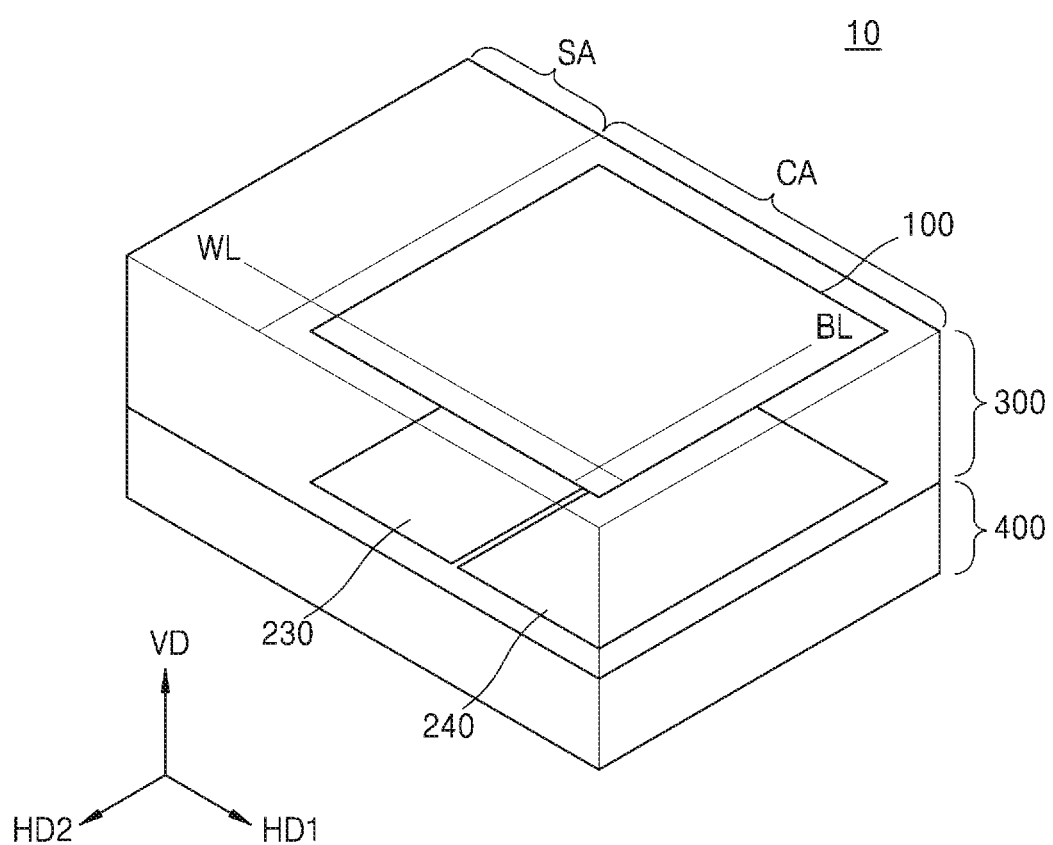
FIG. 2 is a diagram schematically illustrating the structure of a memory device, according to some example embodiments.

In some example embodiments, the memory cell array 100 and at least a portion of the pass transistor circuit 210 may be in an upper or first semiconductor layer (e.g., 300 in FIG. 2), and the row decoder 220, the control logic 230, and the page buffer 240 may be located in a lower or second semiconductor layer (e.g., 400 in FIG. 2). However, the memory device 10 is not limited to these embodiments described above. In some embodiments, at least some of the circuits forming the row decoder 220 may be in an upper semiconductor layer together with the memory cell array 100 and the pass transistor circuit 210, and the others of the circuits forming the pass transistor circuit 210, the control logic 230, and page buffer 240 may be in a lower semiconductor layer.

Figure 8:
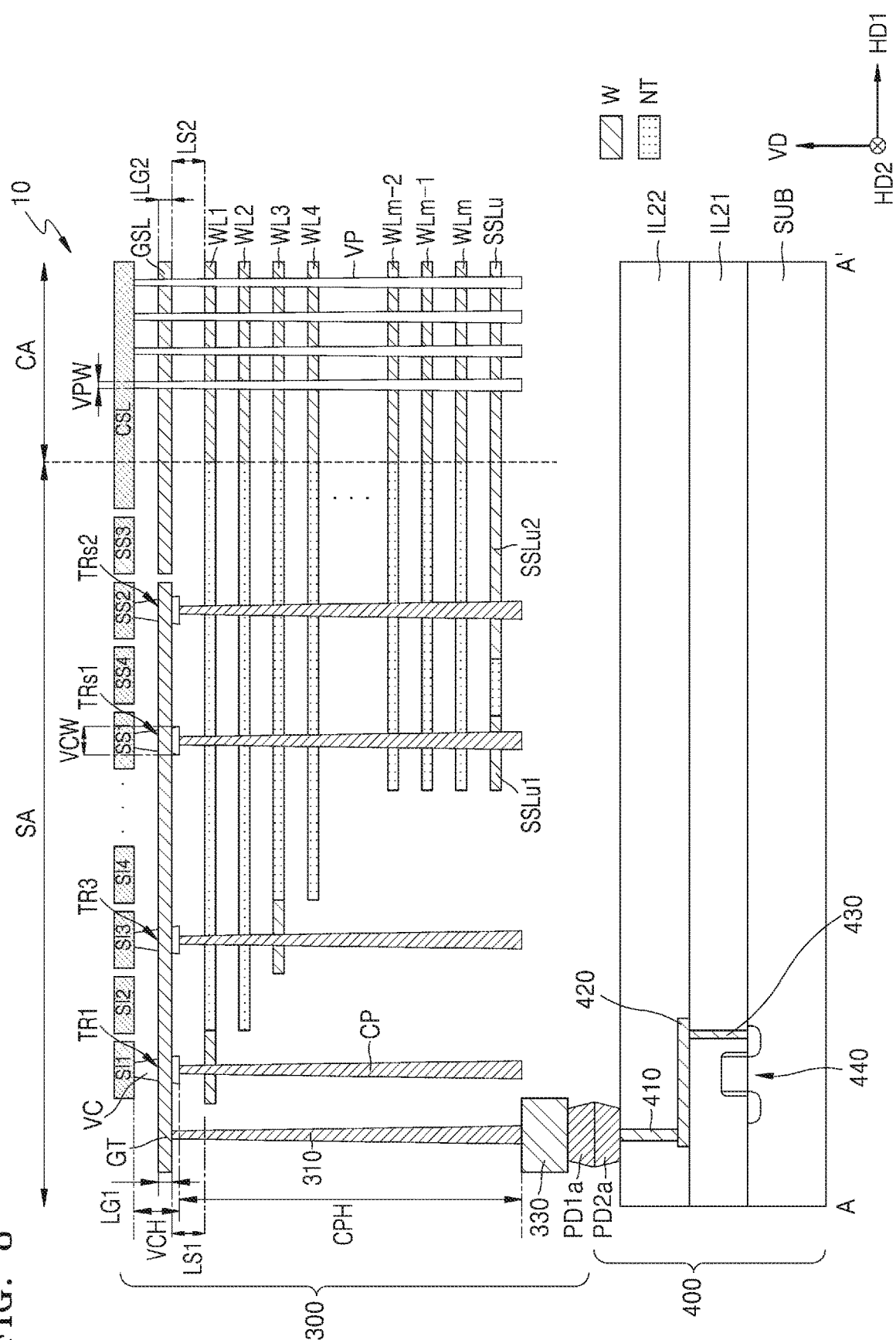
FIG. 8 is a cross-sectional view taken along a line A-A' of FIG. 7, according to some example embodiments.

In some example embodiments, the pass transistor circuit 210 may include a plurality of vertical pass transistors (e.g., TR1, TR3, TRs1, and TRs2 in FIG. 8). For example, a plurality of vertical pass transistors may be on the upper semiconductor layer.

Figure 10A:
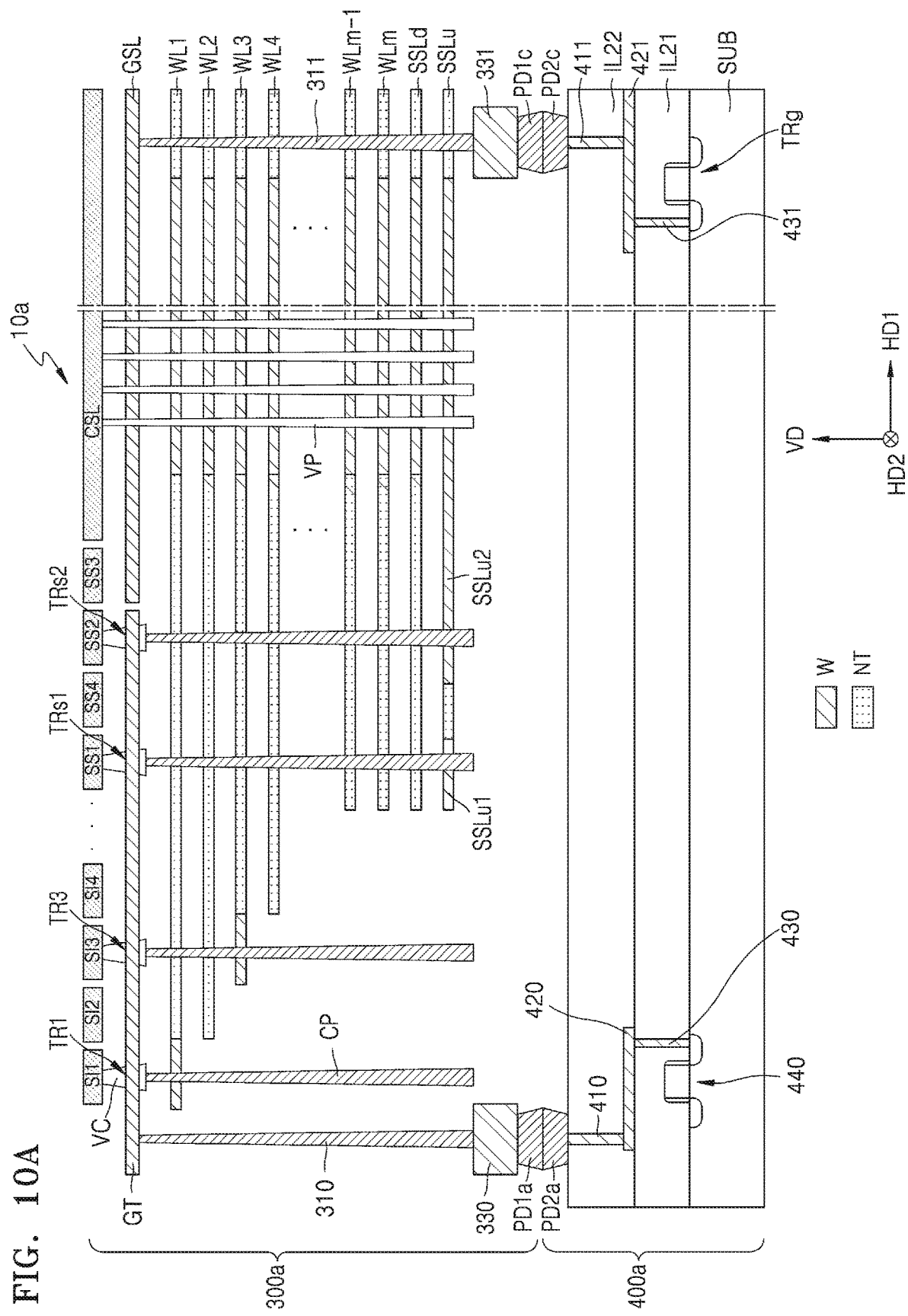
FIGS. 10A through 10C are diagrams of memory devices including the pass transistor circuit in FIG. 5, according to example embodiments.

In some example embodiments, the pass transistor circuit 210 may include at least one normal pass transistor (e.g., TRg in FIG. 10A). For example, a plurality of vertical pass transistors may be on an upper semiconductor layer, and a plurality of normal pass transistors may be on a lower semiconductor layer. However, embodiments are not limited thereto, and at least one normal pass transistor may be on a first semiconductor layer.

The memory cell array 100 may be connected to the page buffer 240 through bit lines BL and to the pass transistor circuit 210 through word lines WL, string selection lines SSL, and ground selection lines GSL. In addition, the pass transistor circuit 210 may be connected to the row decoder 220 through block selection signal lines BS, string selection line driving signal lines SS, word line driving signal lines SI, and ground selection line driving signal lines GS. The string selection line driving signal lines SS, the word line driving signal lines SI, and the ground selection line driving signal lines GS may be referred to as "driving signal lines".

The memory cell array 100 may include a plurality of memory cells. For example, the memory cells may include flash memory cells. Hereinafter, embodiments will be described using, as an example, the case that a plurality of memory cells are NAND flash memory cells. However, embodiments are not limited thereto. In some example embodiments, a plurality of memory cells may be resistive memory cells such as resistive random access memory (ReRAM) cells, phase-change RAM (PRAM) cells, or magnetic RAM (MRAM) cells.

In some example embodiments, the memory cell array 100 may include a three-dimensional (3D) memory cell array. The 3D memory cell array may include a plurality of NAND strings, of which each may include memory cells respectively connected to word lines vertically stacked on a substrate. This will be described in detail with reference to FIGS. 3 and 4. However, embodiments are not limited thereto. In some example embodiments, the memory cell array 100 may include a two-dimensional (2D) memory cell array that may include a plurality of NAND strings in rows and columns.

The control logic 230 may generate various control signals for programming data to the memory cell array 100, reading data from the memory cell array 100, or erasing data from the memory cell array 100 based on a command CMD, an address ADDR, and a control signal CTRL. For example, the control logic 230 may output a row address X-ADDR that is sent to the row decoder 220 and/or a column address Y-ADDR that is sent to the page buffer 240. Accordingly, the control logic 230 may generally control various operations of the memory device 10.

The row decoder 220 may output a block selection signal for selecting one of a plurality of memory blocks to the block selection signal lines BS in response to the row address X-ADDR. In response to the row address X-ADDR, the row decoder 220 may also output a word line driving signal for selecting one of the word lines WL of the selected memory block to the word line driving signal lines SI, a string selection line driving signal for selecting one of the string selection lines SSL to the string selection line driving signal lines SS, and a ground selection line driving signal for selecting one of the ground selection lines GSL to the ground selection line driving signal lines GS. The page buffer 240 may select some of the bit lines BL in response to the column address Y-ADDR. The page buffer 240 may operate as a write driver or a sense amplifier according to an operating mode.

As the level of memory cells arranged in the memory cell array 100 (i.e., the number of word lines WL stacked in the vertical direction) increases with the development of semiconductor processes, the number of pass transistors driving the word lines WL increases, and accordingly, the area of the pass transistor circuit 210 may increase. At least a portion of the pass transistor circuit 210 of the memory device 10 may be in a stair area (e.g., stair area SA in FIG. 2) of the word lines WL. In some example embodiments, the pass transistor circuit 210 may include a plurality of vertical pass transistors in the stair area of the word lines WL. Accordingly, the area of the pass transistor circuit 210 overlaps the stair area of the word lines WL, and therefore, an increase in a chip size of the memory device 10 may be prevented even when the number of pass transistors increases with the increase in the number of stacked layers of the word lines WL. In other words, the overall chip size is reduced by using the overlapping stair area SA.

FIG. 2 is a diagram schematically illustrating the structure of the memory device 10, according to some example embodiments.

Referring to FIGS. 1 and 2, the memory device 10 may include a first semiconductor layer 300 and a second semiconductor layer 400. The first semiconductor layer 300 may be stacked on the top of the second semiconductor layer 400 in a vertical direction VD. In other words, the second semiconductor layer 400 may be on the bottom of the first semiconductor layer 300 in the vertical direction VD.

In some example embodiments, the memory cell array 100 and at least some pass transistors of the pass transistor circuit 210 may be formed in the first semiconductor layer 300, and the row decoder 220, the control logic 230, and the page buffer 240 may be formed in the second semiconductor layer 400. However, embodiments are not limited thereto, and at least a portion of the circuit of the row decoder 220 may be in the first semiconductor layer 300. Accordingly, the memory device 10 may have a cell over periphery (COP) structure, in which the memory cell array 100 is above a portion of the periphery circuit 200 that includes the control logic 230 and/or page buffer 240. The COP structure may effectively reduce a horizontal area and may increase the integration density of the memory device 10.

In some example embodiments, the first semiconductor layer 300 and the second semiconductor layer 400 may be formed in different wafers, respectively, and may be combined with each other using Cu-to-Cu (C2C) wafer bonding, thereby manufacturing the memory device 10. For example, a plurality of bonding pads may be formed on a first surface of the first semiconductor layer 300, and a plurality of bonding pads may be formed on a first surface of the second semiconductor layer 400. The bonding pads of the first semiconductor layer 300 may be connected to the bonding pads of the second semiconductor layer 400. However, the memory device 10 is not limited thereto, and the first semiconductor layer 300 and the second semiconductor layer 400 may be formed in one wafer.

In the first semiconductor layer 300, the word lines WL may extend in a first horizontal direction HD1 and the bit lines BL may extend in a second horizontal direction HD2. The first and second horizontal directions may be perpendicular to one another. Respective ends of the word lines WL may form a stair shape. In this specification, an area that includes the word lines WL in a stair shape in the first semiconductor layer 300 will be referred to as a "stair area SA".

In the first semiconductor layer 300, a vertical channel structure may be formed, thereby forming a cell area CA in which memory cells are formed. Accordingly, the memory cell array 100 may be located in the cell area CA.

Figure 3:
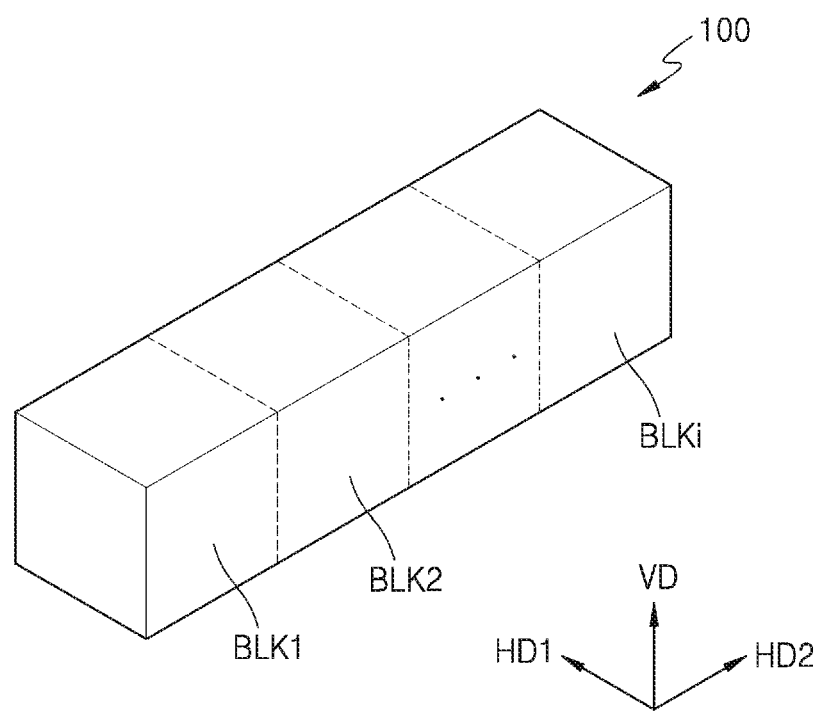
FIG. 3 is a diagram illustrating a memory cell array according to some embodiments.

FIG. 3 is a diagram illustrating the memory cell array 100 according to some embodiments.

Referring to FIG. 3, the memory cell array 100 may include a plurality of memory blocks BLK1 through BLKi, where "i" may be a positive integer. Each of the memory blocks BLK1 through BLKi may have a 3D structure (or a vertical structure). In detail, each of the memory blocks BLK1 through BLKi may include a plurality of NAND strings extending in the vertical direction VD. At this time, the NAND strings may be apart from each other by a certain distance in the first horizontal direction HD1 and the second horizontal direction HD2. The memory blocks BLK1 through BLKi may be selected by a row decoder (e.g., 220 in FIG. 1). For example, the row decoder 220 may select a memory block corresponding to a block address among the memory blocks BLK1 through BLKi.

Figure 4:
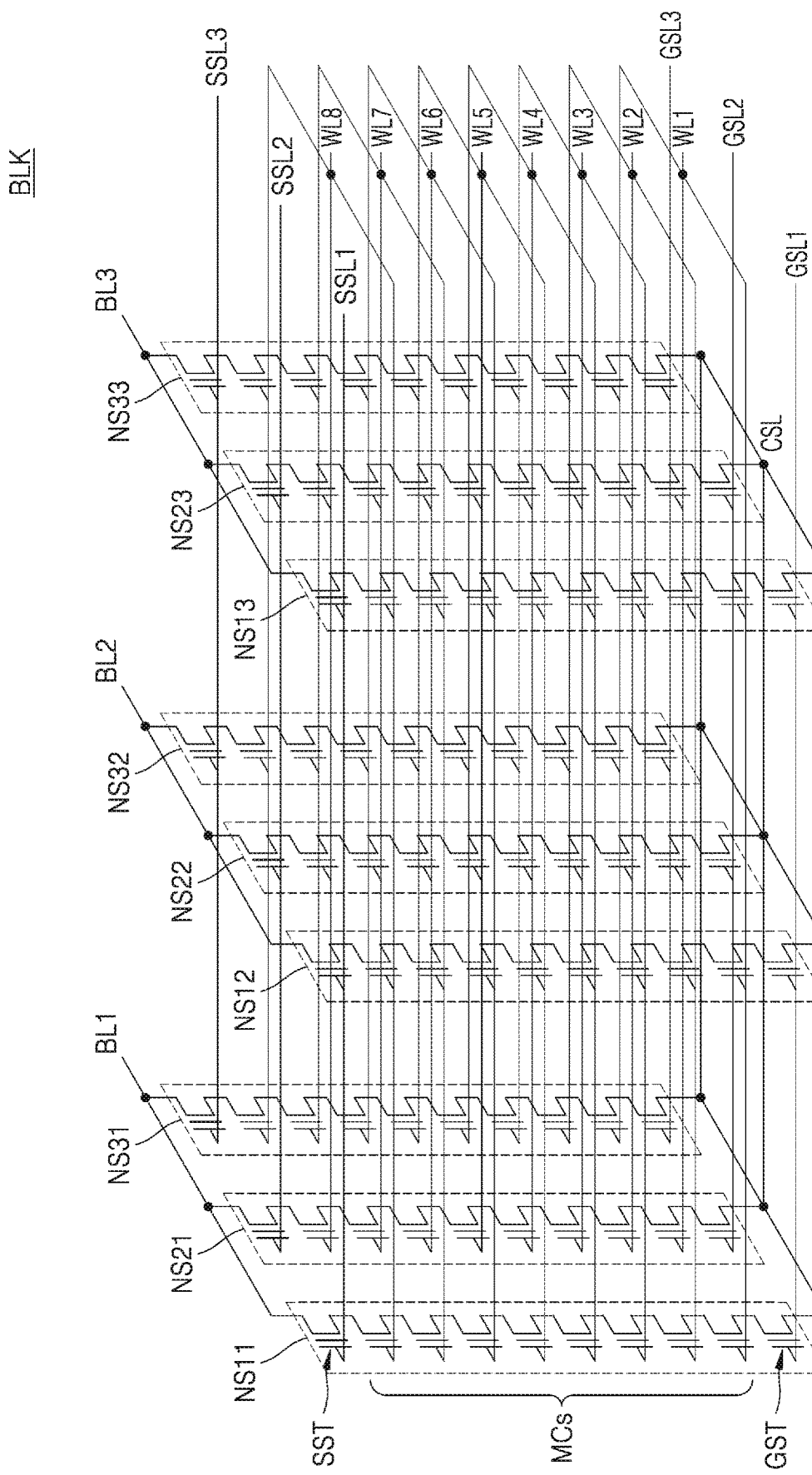
FIG. 4 is a circuit diagram illustrating an equivalent circuit of a memory block, according to some example embodiments.

FIG. 4 is a circuit diagram illustrating an equivalent circuit of a memory block BLK, according to some example embodiments. For example, the memory block BLK may correspond to one of the memory blocks BLK1 through BLKi of FIG. 3.

Referring to FIG. 4, the memory block BLK may include a plurality of NAND strings NS11 through NS33, a plurality of word lines WL1 through WL8, a plurality of first through third bit lines BL1 through BL3, a plurality of ground selection lines GSL1 through GSL3, a plurality of string selection lines SSL1 through SSL3, and a common source line CSL. Here, the number of NAND strings, the number of word lines, the number of bit lines, the number of ground selection lines, and the number of string selection lines may vary with different embodiments.

The NAND strings NS11, NS21, and NS31 may be provided between the first bit line BL1 and the common source line CSL. The NAND strings NS12, NS22, and NS32 may be provided between the second bit line BL2 and the common source line CSL. The NAND strings NS13, NS23, and NS33 may be provided between the third bit line BL3 and the common source line CSL. Each NAND string (e.g., NS11) may include a string selection transistor SST, a plurality of memory cells MCs, and a ground selection transistor GST, which are connected in series.

The string selection transistor SST may be connected to a corresponding one among the string selection lines SSL1 through SSL3. The memory cells MCs may be respectively connected to the word lines WL1 through WL8. The ground selection transistor GST may be connected to a corresponding one among the ground selection lines GSL1 through GSL3. The string selection transistor SST may be connected to a corresponding one among the first through third bit lines BL1 through BL3. The ground selection transistor GST may be connected to the common source line CSL.

In the memory block BLK of FIG. 4, word lines (e.g., WL1) at the same level of depth in the device are connected in common to one another, the string selection lines SSL1 through SSL3 are separated from one another, and the ground selection lines GSL1 through GSL3 are also separated from one another. Although it is illustrated in FIG. 4 that the three string selection lines SSL1 through SSL3 share word lines at the same level, embodiments are not limited thereto. For example, two string selection lines may share word lines at the same level. In another example, four string selection lines may share word lines at the same level.

Figure 5:
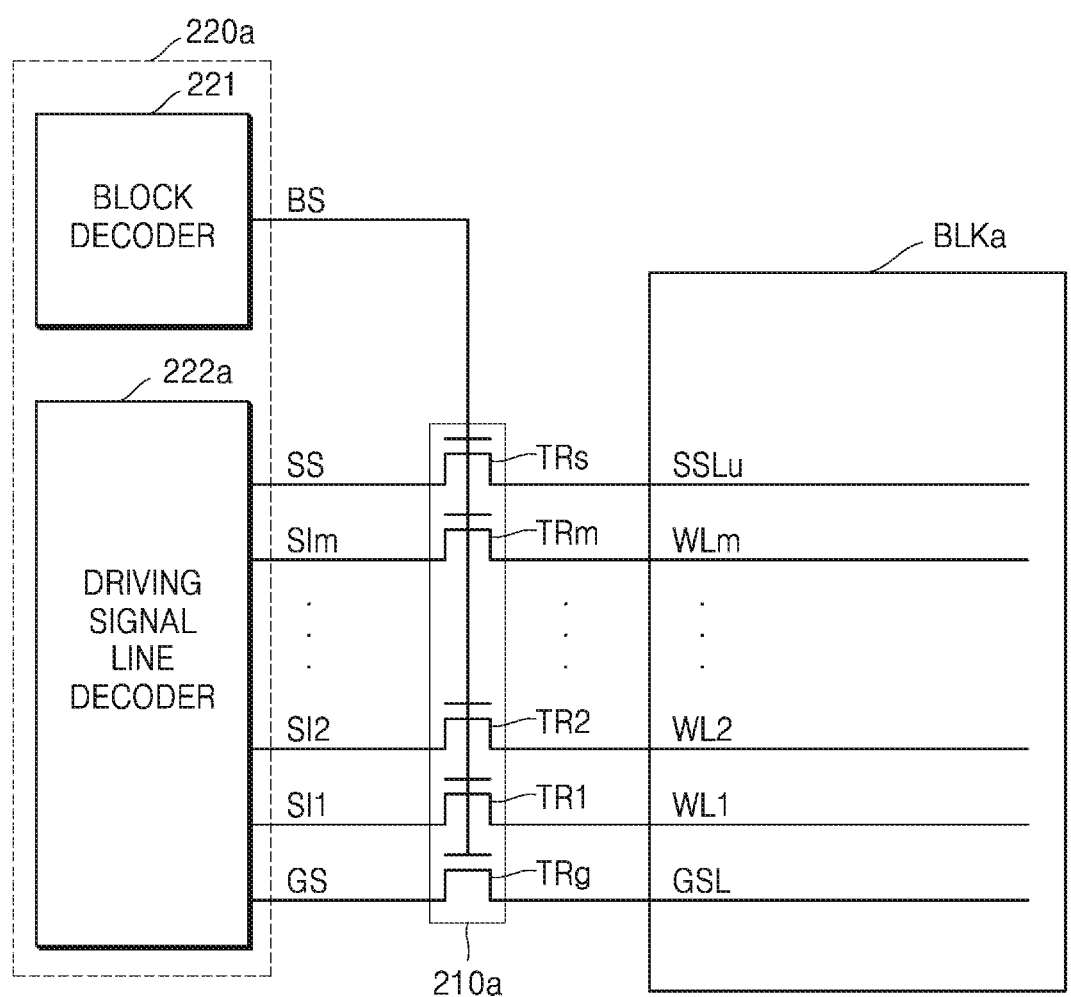
FIG. 5 is a diagram illustrating a row decoder and a pass transistor circuit, according to some example embodiments.

FIG. 5 is a diagram illustrating a row decoder 220a and a pass transistor circuit 210a, according to an example embodiment.

Referring to FIG. 5, a memory block BLKa may correspond to one of the memory blocks BLK1 through BLKi of FIG. 3. The row decoder 220a may be an example of the row decoder 220 in FIG. 1, and the pass transistor circuit 210a may be an example of the pass transistor circuit 210 in FIG. 1.

The row decoder 220a may include a block decoder 221 and a driving signal line decoder 222a. The pass transistor circuit 210a may include a plurality of pass transistors, e.g., a pass transistor TRs, first through m-th pass transistors TR1 through TRm, and a pass transistor TRg, where "m" may be a positive integer. The pass transistor circuit 210a may be provided for each of memory blocks (e.g., BLK1 through BLKi of FIG. 3), and the block decoder 221 and the driving signal line decoder 222a may be provided in common for the memory blocks (e.g., BLK1 through BLKi of FIG. 3).

The block decoder 221 may be connected to the pass transistor circuit 210a through a block selection signal line BS. For example, the block selection signal line BS may be connected to respective gates of the pass transistors, e.g., the pass transistor TRs, the first through m-th pass transistors TR1 through TRm, and the pass transistor TRg. When a block selection signal provided through the block selection signal line BS is activated, the pass transistors, e.g., the pass transistor TRs, the first through m-th pass transistors TR1 through TRm, and the pass transistor TRg, are turned on, and accordingly, the memory block BLKa may be selected.

The driving signal line decoder 222a may be connected to the pass transistor circuit 210a through a string selection line driving signal line SS, first through m-th word line driving signal lines SI1 through SIm, and a ground selection line driving signal line GS. In detail, the string selection line driving signal line SS, the first through m-th word line driving signal lines SI1 through SIm, and the ground selection line driving signal line GS may be respectively connected to respective sources of the pass transistors, e.g., the pass transistor TRs, the first through m-th pass transistors TR1 through TRm, and the pass transistor TRg. For example, the first word line driving signal line SI1 may be connected to the first pass transistor TR1, the second word line driving signal line SI2 may be connected to the second pass transistor TR2, and the m-th word line driving signal line SIm may be connected to the m-th pass transistor TRm.

The pass transistor circuit 210a may be connected to the memory block BLKa through a ground selection line GSL, first through m-th word lines WL1 through WLm, and a string selection line SSLu. The first through m-th pass transistors TR1 through TRm may respectively connect the first through m-th word lines WL1 through WLm to the first through m-th word line driving signal lines SI1 through SIm. For example, the first pass transistor TR1 may be connected to the first word line WL1 and may connect the first word line WL1 to the first word line driving signal line SI1. The second pass transistor TR2 may be connected to the second word line WL2 and may connect the second word line WL2 to the second word line driving signal line SI2. The m-th pass transistor TRm may be connected to the m-th word line WLm and may connect the m-th word line WLm to the m-th word line driving signal line SIm.

The pass transistor TRs may connect the string selection line SSLu to the string selection line driving signal line SS corresponding to the string selection line SSLu. The pass transistor TRg may connect the ground selection line GSL to the ground selection line driving signal line GS corresponding to the ground selection line GSL. For example, when a block selection signal is activated, the pass transistor TRs, the first through m-th pass transistors TR1 through TRm, and the pass transistor TRg may respectively provide driving signals, which are respectively provided through the string selection line driving signal line SS, the first through m-th word line driving signal lines SI1 through SIm, and the ground selection line driving signal line GS, to the string selection line SSLu, the first through m-th word lines WL1 through WLm, and the ground selection line GSL.

In some example embodiments, the pass transistor TRs and the first through m-th pass transistors TR1 through TRm may be implemented as vertical pass transistors. In this specification, the term "vertical pass transistor" refers to a transistor including a vertical channel. For example, the pass transistor TRs and the first through m-th pass transistors TR1 through TRm may be in a stair area (e.g., SA in FIG. 2) of word lines. In some example embodiments, the pass transistor TRg may be implemented as a normal pass transistor. In this specification, the term "normal pass transistor" refers to a transistor including a horizontal channel. For example, the pass transistor TRg may be in a second semiconductor layer (e.g., 400 in FIG. 2). This will be described with reference to the drawings including FIG. 10A.

FIG. 6 is a diagram showing voltages applied to a word line driving signal line in each memory operation, according to some embodiments.

Referring to FIGS. 5 and 6, a selected word line driving signal line SIa may correspond to a driving signal line connected to a selected word line WLsel, and an unselected word line driving signal line SIb may correspond to a driving signal line connected to an unselected word line WLunsel. In a program operation, a program voltage Vpgm (e.g., about 20 V) may be applied to the selected word line driving signal line SIa among the first through m-th word line driving signal lines SI1 through SIm. A pass voltage Vpass (e.g., about 9 V) may be applied to the unselected word line driving signal line SIb among the first through m-th word line driving signal lines SI1 through SIm. In a read operation, a read voltage Vr (e.g., about 0 V) may be applied to the selected word line driving signal line SIa and a read pass voltage Vread (e.g., about 6 V) may be applied to the unselected word line driving signal line SIb. In an erase operation, an erase voltage Ver (e.g., about 0 V) may be applied to both the selected word line driving signal line SIa and the unselected word line driving signal line SIb.

Figure 7:
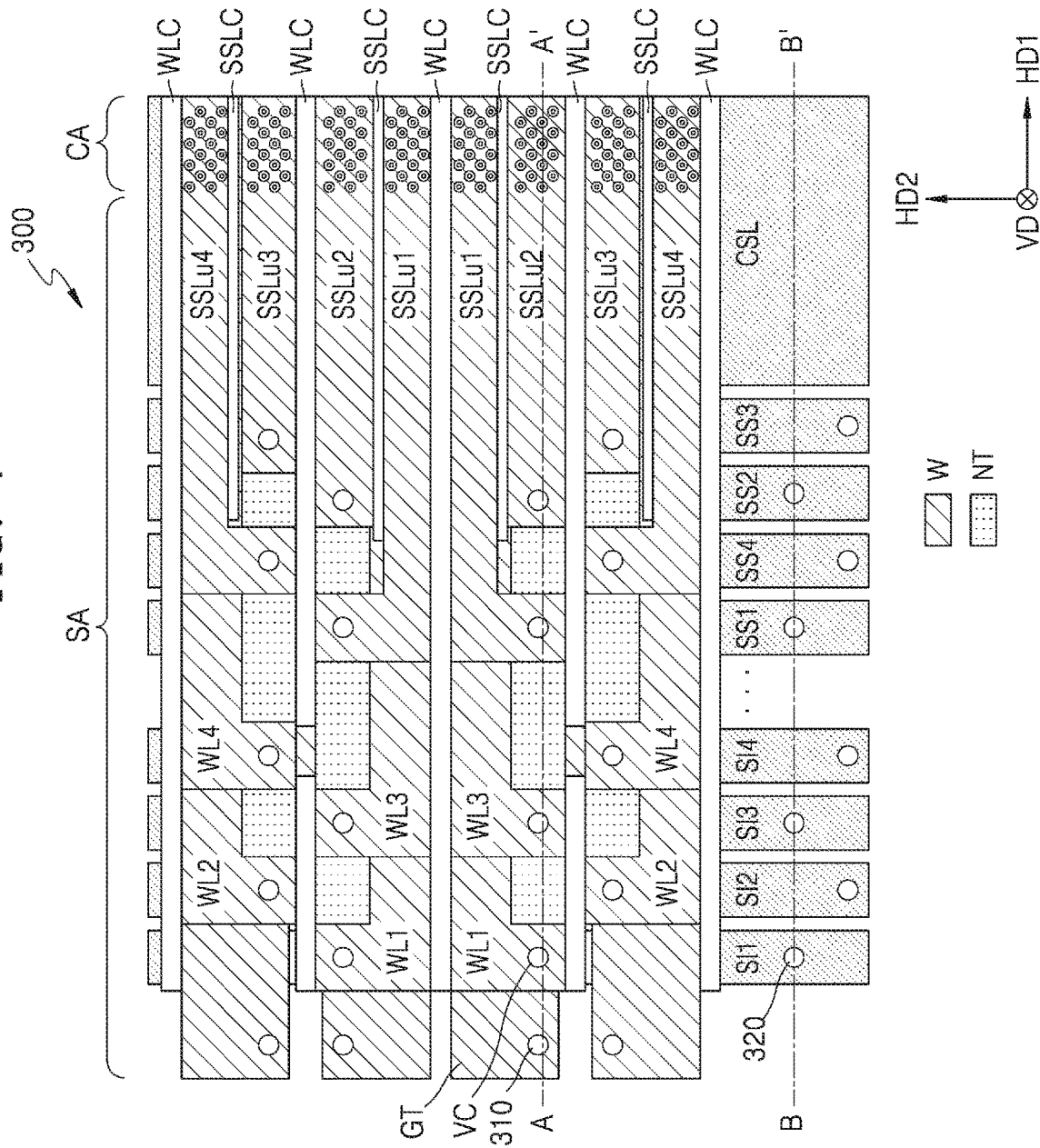
FIG. 7 is a diagram of a memory device including the pass transistor circuit in FIG. 5, according to some example embodiments.
Figure 9:
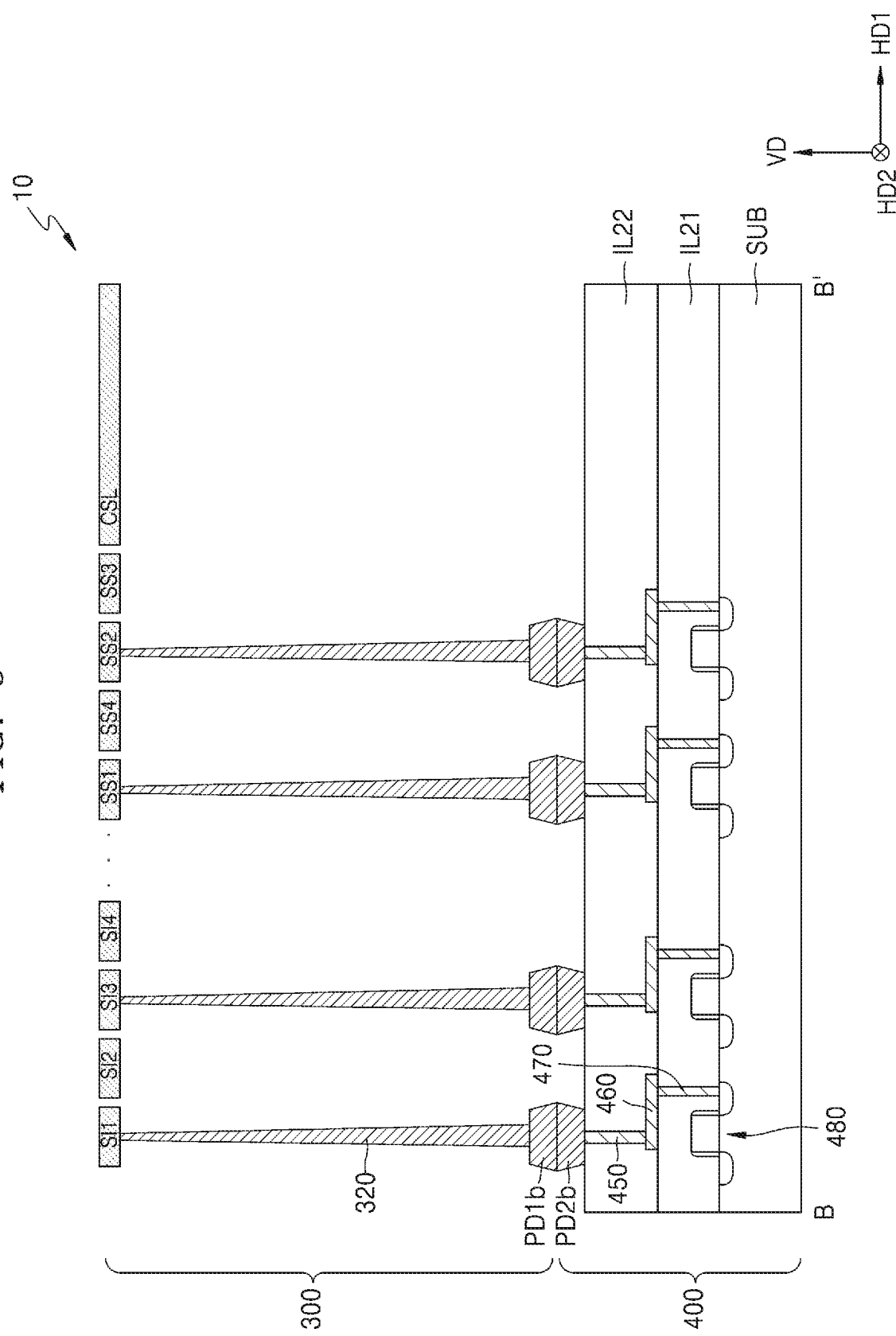
FIG. 9 is a cross-sectional view taken along a line B-B' of FIG. 7, according to some example embodiments.

FIG. 7 is a diagram of the memory device 10 including the pass transistor circuit 210a in FIG. 5, according to some example embodiments. FIG. 8 is a cross-sectional view taken along a line A-A' of FIG. 7, according to some example embodiments. FIG. 9 is a cross-sectional view taken along a line B-B' of FIG. 7, according to some example embodiments. In detail, FIG. 7 is a diagram of the first semiconductor layer 300 of the memory device 10, which is viewed from below in the vertical direction VD.

Referring to FIGS. 7 and 8, the first semiconductor layer 300 of the memory device 10 may include a plurality of word lines, e.g., the first through m-th word lines WL1 through WLm. The first through m-th word lines WL1 through WLm may be sequentially stacked in an opposite direction to the vertical direction VD and may extend in the first horizontal direction HD1. Although not shown, the first through m-th word lines WL1 through WLm may be electrically insulated by a plurality of insulating layers. Respective ends of the first through m-th word lines WL1 through WLm in the first horizontal direction HD1 may be implemented in a stair shape in the stair area SA.

Each of the first through m-th word lines WL1 through WLm may include a conductive region W and an insulating region NT in the stair area SA. For example, each of the first through m-th word lines WL1 through WLm may include the conductive region W, which is in contact with a contact CP corresponding to each word line, and the insulating region NT, which is in contact with a contact CP not corresponding thereto (e.g., a contact CP connected to another word line).

Here, the conductive region W may include a conductive material such as tungsten but is not limited to tungsten. The insulating region NT may include an insulating material such as nitride but is not limited to nitride.

The first word line WL1 may be below a gate GT, and the second through m-th word lines WL2 through WLm may be sequentially formed below the first word line WL1 in the opposite direction to the vertical direction VD.

Each of the first through m-th word lines WL1 through WLm may be connected to a vertical channel VC corresponding thereto through the contact CP corresponding thereto. For example, the vertical channel VC corresponding to the first word line WL1 may be connected to the first word line driving signal line SI1, the vertical channel VC corresponding to the second word line WL2 may be connected to the second word line driving signal line SI2, the vertical channel VC corresponding to the third word line WL3 may be connected to the third word line driving signal line SI3, and the vertical channel VC corresponding to the fourth word line WL4 may be connected to the fourth word line driving signal line SI4. The first through m-th word lines WL1 through WLm may extend in the first horizontal direction HD1, and a word line at one level may be divided by a word line cut region WLC.

The first semiconductor layer 300 of the memory device 10 may include the ground selection line GSL above the first through m-th word lines WL1 through WLm and the common source line CSL above the ground selection line GSL. In some example embodiments, a plurality of driving signal lines, e.g., the first through fourth word line driving signal lines SI1 through SI4 and first through fourth string selection line driving signal lines SS1 through SS4, and the common source line CSL may be arranged in the same level (i.e., the same layer). For example, a plurality of driving signal lines, e.g., the first through fourth word line driving signal lines SI1 through SI4 and first through fourth string selection line driving signal lines SS1 through SS4, and the common source line CSL may be formed by the same process. In some example embodiments, a plurality of driving signal lines, e.g., the first through fourth word line driving signal lines SI1 through SI4 and the first through fourth string selection line driving signal lines SS1 through SS4, may extend in the second horizontal direction HD2 and may be apart from one another in the first horizontal direction HD1. In some example embodiments, the common source line CSL may extend in the second horizontal direction HD2 and may be implemented by a metal plate. Although only the first through fourth word line driving signal lines SI1 through SI4 are illustrated in FIGS. 7 and 8 for convenience of description, the first through m-th word line driving signal lines SI1 through SIm may be included in the memory device 10 to respectively correspond to the first through m-th word lines WL1 through WLm, thereby respectively providing corresponding word line driving signals to the first through m-th word lines WL1 through WLm.

The first semiconductor layer 300 of the memory device 10 may further include string selection lines SSLu below the first through m-th word lines WL1 through WLm. For example, the string selection lines SSLu may include first through fourth string selection lines SSLu1 through SSLu4. The first through fourth string selection lines SSLu1 through SSLu4 may be arranged in the same level and may be separated from each other by a string selection line cut region SSLC. Each of the first through fourth string selection lines SSLu1 through SSLu4 may be connected to the vertical channel VC corresponding thereto through the contact CP corresponding thereto. The vertical channel VC corresponding to the first string selection line SSLu1 may be connected to the first string selection line driving signal line SS1, the vertical channel VC corresponding to the second string selection line SSLu2 may be connected to the second string selection line driving signal line SS2, the vertical channel VC corresponding to the third string selection line SSLu3 may be connected to the third string selection line driving signal line SS3, and the vertical channel VC corresponding to the fourth string selection line SSLu4 may be connected to the fourth string selection line driving signal line SS4.

Although it is illustrated in FIG. 8 that the memory device 10 includes the string selection line SSLu of one layer, embodiments are not limited thereto. In some example embodiments, the memory device 10 may include two string selection lines (e.g., SSLu and SSLd in FIG. 10A) stacked in the vertical direction VD.

In some example embodiments, the ground selection line GSL, the string selection line SSLu, and the gate GT may include the same material as the first through m-th word lines WL1 through WLm. For example, the ground selection line GSL, the string selection line SSLu, and the gate GT may include the same material as the conductive region W.

A plurality of vertical channel structures VP may be in the channel area CA of the first semiconductor layer 300, and a memory cell array may be formed in the channel area CA. The plurality of vertical channel structures VP may extend in the vertical direction VD and penetrate through the first through m-th word lines WL1 through WLm and a plurality of insulating layers formed among the first through m-th word lines WL1 through WLm. The plurality of vertical channel structures VP may be referred to as a vertical pillar. In some example embodiments, each of the plurality of vertical channel structures VP may have a first width VPW in the first horizontal direction HD1. For example, each of the plurality of vertical channel structures VP may have an annular shape. At this time, the first width VPW may correspond to a first channel hole size. However, embodiments are not limited thereto. Each of the plurality of vertical channel structures VP may have an elliptic pillar shape or a quadrangular pillar shape. A plurality of vertical channel structures VP may be spaced apart from each other in the first horizontal direction HD1 and the second horizontal direction HD2.

In some example embodiments, each of the vertical channel structures VP may include a charge storage layer, a channel layer, and an inner layer. The channel layer may include a silicon material having a first type (e.g., a P type) and may function as a channel area. The inner layer may include an insulating material, such as silicon oxide, or an air gap. The charge storage layer may include a gate insulating layer (or referred to as a "tunneling insulating layer"), a charge trap layer, and/or a blocking insulating layer. For example, the charge storage layer may have an oxide-nitride-oxide (ONO) structure.

Drains or drain contacts may be respectively provided below the vertical channel structures VP. For example, the drains or the drain contacts may include a silicon material doped with impurities having a second conductivity type (e.g., an N type). Bit lines (e.g., BL in FIG. 2) may be provided below the drain contacts and may respectively connected to the drain contacts through bit line contacts. Each of the bit lines may be connected to a page buffer in the second semiconductor layer 400 through a pad.

A plurality of vertical pass transistors, e.g., first and third vertical pass transistors TR1 and TR3 and vertical pass transistors TRs1 and TRs2, may be in the stair area SA. Although only the first and third vertical pass transistors TR1 and TR3 and the vertical pass transistors TRs1 and TRs2 are illustrated in FIG. 8 for convenience of description, the second and fourth through m-th pass transistors TR2 and TR4 through TRm in FIG. 5 may be formed in the stair area SA as vertical pass transistors, and the descriptions of the first and third vertical pass transistors TR1 and TR3 and the vertical pass transistors TRs1 and TRs2 may also be applied to the second and fourth through m-th pass transistors TR2 and TR4 through TRm.

Each of the first and third vertical pass transistors TR1 and TR3 and the vertical pass transistors TRs1 and TRs2 may be connected to a corresponding line among the first through m-th word lines WL1 through WLm and the string selection lines SSLu and to a corresponding one of a plurality of driving signal lines, e.g., the first through fourth word line driving signal lines SI1 through SI4 and the first through fourth string selection line driving signal lines SS1 through SS4. For example, the first vertical pass transistor TR1 may be connected between the first word line WL1 and the first word line driving signal line SI1, and the third vertical pass transistor TR3 may be connected between the third word line WL3 and the third word line driving signal line SI3. The vertical pass transistor TRs1 may be connected between the first string selection line SSLu1 and the first string selection line driving signal line SS1, and the vertical pass transistor TRs2 may be connected between the second string selection line SSLu2 and the second string selection line driving signal line SS2.

Each of the first and third vertical pass transistors TR1 and TR3 and the vertical pass transistors TRs1 and TRs2 may include the vertical channel VC extending in the vertical direction VD. In some example embodiments, a plurality of vertical channels VC may have the same height, e.g., a first height VCH, in the vertical direction VD. In some example embodiments, bottom levels of the vertical channels VC may be higher than a top level of the first word line WL1, which is at the top among the first through m-th word lines WL1 through WLm. For example, the bottom levels of the vertical channels VC may be between the first word line WL1 and the ground selection line GSL.

The vertical channels VC may have a second width VCW in the first horizontal direction HD1. In some example embodiments, the second width VCW may be greater than the first width WPW of the vertical channel structures VP. Accordingly, a breakdown issue of the first and third vertical pass transistors TR1 and TR3 and the vertical pass transistors TRs1 and TRs2 may be resolved. That is, by forming the widths of the vertical pass transistors TR1, TR3, TRs1, and TRs2 relatively wide, the vertical pass transistors TR1, TR3, TRs1, and TRs2 are formed to withstand high voltage, and the breakdown issue of the vertical pass transistors TR1, TR3, TRs1, and TRs2 may be resolved. For example, the second width VCW may be at least about twice the first width VPW. However, embodiments are not limited thereto. The first width VPW and the second width VCW may vary with embodiments.

In some example embodiments, the vertical channels VC may be formed in the same structure using the same process as the vertical channel structures VP. Therefore, like the vertical channel structures VP, the vertical channels VC may include a charge storage layer, a channel layer, and an inner layer. However, embodiments are not limited thereto. In some example embodiments, the vertical channels VC may include only a channel layer and an inner layer.

The vertical channels VC respectively included in the first and third vertical pass transistors TR1 and TR3 and the vertical pass transistors TRs1 and TRs2 may be connected in common to the gate GT. In some example embodiments, the gate GT connected in common to the first and third vertical pass transistors TR1 and TR3 and the vertical pass transistors TRs1 and TRs2 may be at the same level as the ground selection line GSL.

In some example embodiments, the vertical channels VC respectively included in the first and third vertical pass transistors TR1 and TR3 and the vertical pass transistors TRs1 and TRs2 may be respectively connected to different gates. At this time, the different gates may have different lengths in the vertical direction VD, and the first and third vertical pass transistors TR1 and TR3 and the vertical pass transistors TRs1 and TRs2 may have different driving performance.

In some example embodiments, a first length LG1 of the gate GT may be substantially the same as a second length LG2 of the ground selection line GSL in the vertical direction VD. In some example embodiments, a third length LS1 of an insulating layer below the gate GT may be substantially the same as a fourth length LS2 of an insulating layer below the ground selection line GSL in the vertical direction VD. However, embodiments are not limited thereto. The first length LG1 may be different from the second length LG2, and the third length LS1 may be different from the fourth length LS2.

In some example embodiments, the second length LG2 of the ground selection line GSL may be substantially the same as a length of each of the first through m-th word lines WL1 through WLm in the vertical direction VD, but embodiments are not limited thereto. In some example embodiments, the second length LG2 may be substantially the same as a length of the string selection line SSLu in the vertical direction VD, but embodiments are not limited thereto.

The contact CP may be in each of the first and third vertical pass transistors TR1 and TR3 and the vertical pass transistors TRs1 and TRs2. Each of the first and third vertical pass transistors TR1 and TR3 and the vertical pass transistors TRs1 and TRs2 may be connected to a corresponding line among the first through m-th word lines WL1 through WLm and the string selection lines SSLu through the contact CP corresponding thereto. For example, the first vertical pass transistor TR1 may be connected to the first word line WL1 through the contact CP corresponding to the first vertical pass transistor TR1, and the third vertical pass transistor TR3 may be connected to the third word line WL3 through the contact CP corresponding to the third vertical pass transistor TR3. The vertical pass transistor TRs1 may be connected to the first string selection line SSLu1 through the contact CP corresponding to the vertical pass transistor TRs1, and the vertical pass transistor TRs2 may be connected to the second string selection line SSLu2 through the contact CP corresponding to the vertical pass transistor TRs2.

In some example embodiments, a plurality of contacts CP respectively connected to the vertical channels VC may have the same height, e.g., a second height CPH, in the vertical direction VD. Accordingly, the contacts CP may be easily formed in the memory device 10.

Referring to FIGS. 8 and 9, the second semiconductor layer 400 may include a substrate SUB, a first lower insulating layer IL21, and/or a second lower insulating layer IL22. The first semiconductor layer 300 may be combined with the second semiconductor layer 400 by C2C wafer bonding. At this time, a plurality of bonding pads PD1a and PD1b may be formed on a first surface of the first semiconductor layer 300, and a plurality of bonding pads PD2a and PD2b may be formed on a first surface of the second semiconductor layer 400. The first surface of the first semiconductor layer 300 may be bonded to the first surface of the second semiconductor layer 400. In some example embodiments, an I/O pad forming process and a back-lap process may be sequentially performed on a second surface opposite the first surface of the first semiconductor layer 300.

The gate GT may be connected to a transistor 440 through an interconnection, which includes a first contact 310, a metal pattern 330, and the bonding pad PD1a that are included in the first semiconductor layer 300 and the bonding pad PD2a, contacts 410 and 430, and a metal pattern 420 that are included in the second semiconductor layer 400. The first word line driving signal line SI1 may be connected to a transistor 480 through an interconnection, which includes a contact 320 and the bonding pad PD1b that are included in the first semiconductor layer 300 and the bonding pad PD2b, contacts 450 and 470, and a metal pattern 460 that are included in the second semiconductor layer 400. Although not shown, each of a plurality of driving signal lines (e.g., SI2 through SI4 and SS1 through SS4) except for the first word line driving signal line SI1 may be connected to a transistor through an interconnection, which includes a contact CP and a bonding pad that are included in the first semiconductor layer 300 and a bonding pad, a contact, and a metal pattern that are included in the second semiconductor layer 400.

In some example embodiments, at least a portion of a row decoder (e.g., 220a in FIG. 5) may be below vertical pass transistors (e.g., TR1, TR3, TRs1, and TRs2) in the vertical direction VD. For example, at least one selected from the block decoder 221 and the driving signal line decoder 222a in FIG. 5 may be below the vertical pass transistors (e.g., TR1, TR3, TRs1, and TRs2) in the vertical direction VD and may include the transistor 440.

Figure 10B:
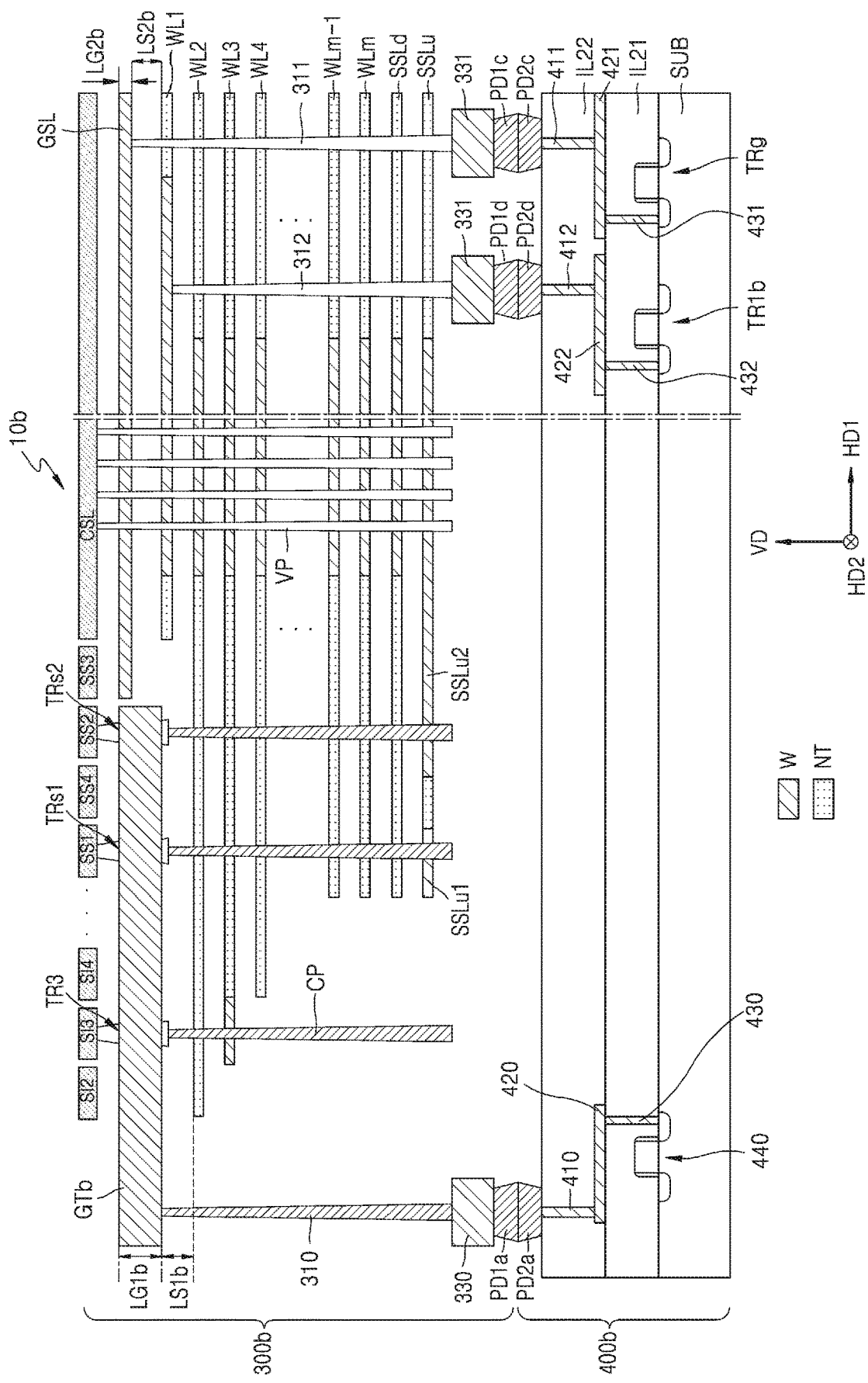
Figure 10C:
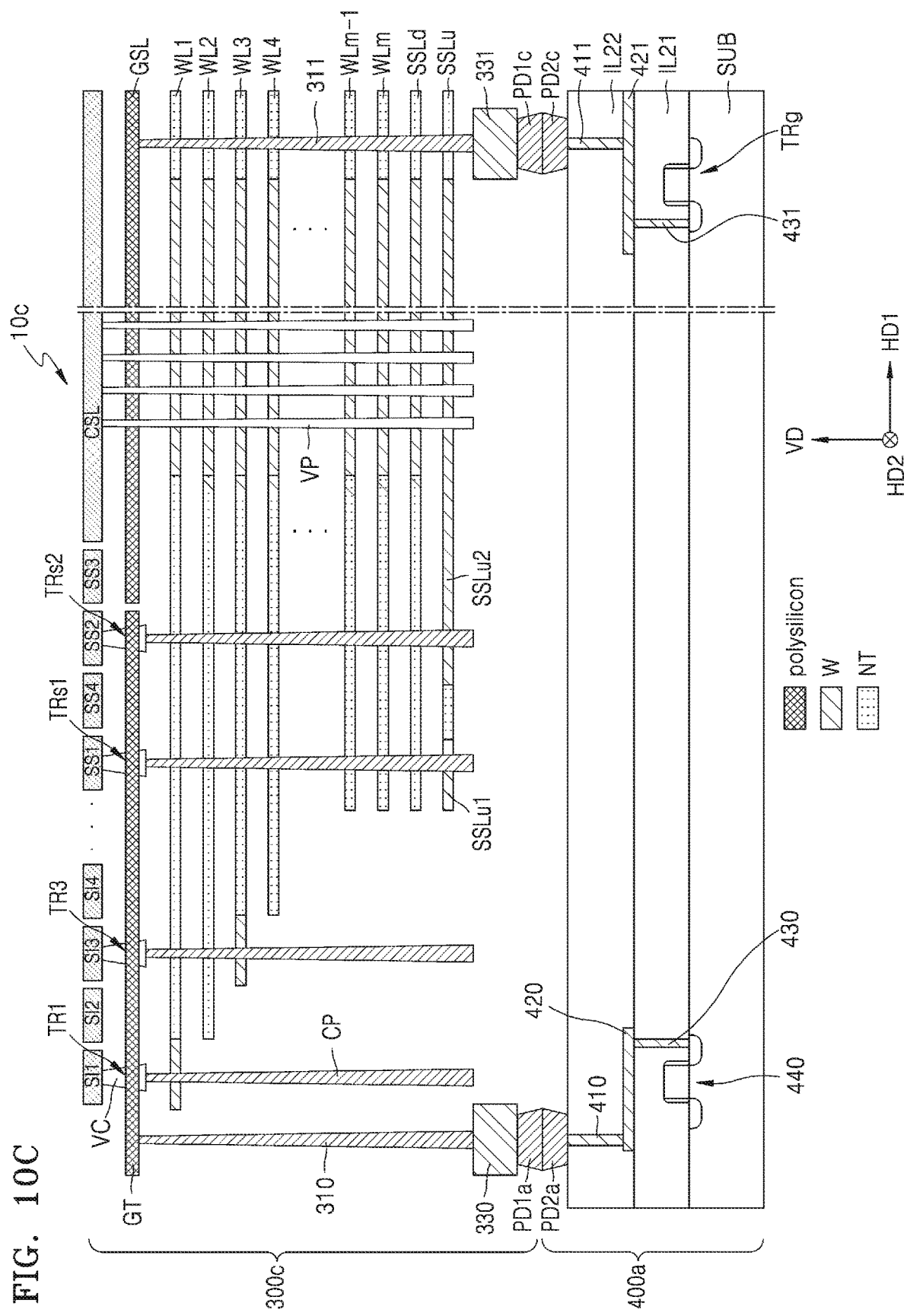

FIGS. 10A through 10C are diagrams of memory devices 10a, 10b, and 10c including the pass transistor circuit 210a in FIG. 5, according to example embodiments. Redundant descriptions of like numerals in FIGS. 8, 9 and 10A through 10C will be omitted.

Referring to FIG. 10A, the memory device 10a may include an upper string selection line SSLd, which are stacked on the string selection lines SSLu. Therefore, the string selection lines SSLu described above may be represented by the lower string selection lines SSLu in FIGS. 10A through 10C. For example, the upper string selection line SSLd may be stacked on the lower string selection lines SSLu in the vertical direction VD. The lower string selection lines SSLu may include a first lower string selection line SSLu1 and a second lower string selection line SSLu2, which are located at the same level. A plurality of vertical channel structures VP may extend in the vertical direction VD and penetrate through the ground selection line GSL, the first through m-th word lines WL1 through WLm, the upper string selection line SSLd, and/or the lower string selection lines SSLu.

In the memory device 10a, some of a plurality of pass transistors (e.g., TRs, TR1 through TRm, and TRg in FIG. 5) may be formed as vertical pass transistors in a first semiconductor layer 300a, and the others of the pass transistors may be formed as normal pass transistors in a second semiconductor layer 400a. For example, the pass transistor TRg connected to the ground selection line GSL, which is in the same layer as the gate GT among the ground selection line GSL, the first through m-th word lines WL1 through WLm, the upper string selection line SSLd, and the lower string selection lines SSLu, may be formed as a normal pass transistor in the second semiconductor layer 400a. The ground selection line GSL may be connected to the pass transistor TRg through an interconnection, which includes a second contact 311, a metal pattern 331, and a bonding pad PD1c that are included in the first semiconductor layer 300a and a bonding pad PD2c, contacts 411 and 431, and a metal pattern 421 that are included in the second semiconductor layer 400a.

The second contact 311 may extend in the vertical direction VD to be in contact with the ground selection line GSL and may penetrate through the first through m-th word lines WL1 through WLm, the upper string selection line SSLd, and the lower string selection lines SSLu. The first through m-th word lines WL1 through WLm, the upper string selection line SSLd, and the lower string selection lines SSLu may include the insulating region NT contacting the second contact 311 and may thus be insulated from the second contact 311.

In the memory device 10a, the gate GT connected in common to a plurality of vertical pass transistors (e.g., TR1, TR3, TRs1, and TRs2) is at the same level as the ground selection line GSL, and therefore, the pass transistor TRg connected to the ground selection line GSL may be formed in the second semiconductor layer 400a. However, embodiments are not limited thereto. The pass transistor TRg connected to the ground selection line GSL may be formed in the first semiconductor layer 300a as a normal transistor or a vertical pass transistor.

Referring to FIG. 10B, the memory device 10b may include a gate GTb forming the third vertical pass transistor TR3 and the vertical pass transistors TRs1 and TRs2. In some example embodiments, a first length LG1b of the gate GTb may be different from a second length LG2b of the ground selection line GSL in the vertical direction VD. For example, the first length LG1b of the gate GTb may be greater than the second length LG2b of the ground selection line GSL. In some example embodiments, a third length LS1b of an insulating layer below the gate GTb may be different from a fourth length LS2b of an insulating layer below the ground selection line GSL in the vertical direction VD.

When the first length LG1b of the gate GTb in the vertical direction VD increases, a high voltage may be applied to the gate electrode of the third vertical pass transistor TR3 and the vertical pass transistors TRs1 and TRs2, i.e., the gate GTb, and the driving speed of the third vertical pass transistor TR3 and the vertical pass transistors TRs1 and TRs2 may be increased. In addition, a breakdown issue of the first and third vertical pass transistors TR1 and TR3 and the vertical pass transistors TRs1 and TRs2 may be resolved.

In some example embodiments, the pass transistor TRg and a first pass transistor TR1b of the memory device 10b may be in a second semiconductor layer 400b and may be normal pass transistors. For example, the ground selection line GSL may be connected to the pass transistor TRg through an interconnection, which includes the second contact 311, the metal pattern 331, and the bonding pad PD1c that are included in a first semiconductor layer 300b and the bonding pad PD2c, the contacts 411 and 431, and the metal pattern 421 that are included in the second semiconductor layer 400b. For example, the first word line WL1 may be connected to the first pass transistor TR1b through an interconnection, which includes a third contact 312, a metal pattern 331, and a bonding pad PD1d that are included in the first semiconductor layer 300b and a bonding pad PD2d, contacts 412 and 432, and a metal pattern 422 that are included in the second semiconductor layer 400b.

The third contact 312 may extend in the vertical direction VD to be in contact with the first word line WL1 and may penetrate through the second through m-th word lines WL2 through WLm, the upper string selection line SSLd, and the lower string selection lines SSLu. The second through m-th word lines WL2 through WLm, the upper string selection line SSLd, and the lower string selection lines SSLu may include the insulating region NT contacting the third contact 312. Accordingly, the second through m-th word lines WL2 through WLm, the upper string selection line SSLd, and the lower string selection lines SSLu may be insulated from the third contact 312.

Although it has been described with reference to FIG. 10B that the pass transistor TRg and the first pass transistor TR1b are in the second semiconductor layer 400b, embodiments are not limited thereto. When a dummy word line (e.g., DWL1 in FIG. 12) is formed between the ground selection line GSL and the first word line WL1, a pass transistor (e.g., TRd1 in FIG. 12) connected to the dummy word line may be in the second semiconductor layer 400b.

Referring to FIG. 10C, the gate GT and the ground selection line GSL, which are formed in a first semiconductor layer 300c, may be formed of a different material than the first through m-th word lines WL1 through WLm. For example, the gate GT and the ground selection line GSL may include polysilicon and the first through m-th word lines WL1 through WLm may include tungsten. However, this is just an example, and the gate GT and the ground selection line GSL may include various materials.

Since the gate GT and the ground selection line GSL are formed of a different material than the first through m-th word lines WL1 through WLm in the memory device 10c, when the ground selection line GSL, the second through m-th word lines WL2 through WLm, the upper string selection line SSLd, and the lower string selection lines SSLu are partially etched to form the word line cut region WLC, the gate GT and the ground selection line GSL may limit etching and prevent overetch.

Figure 11:
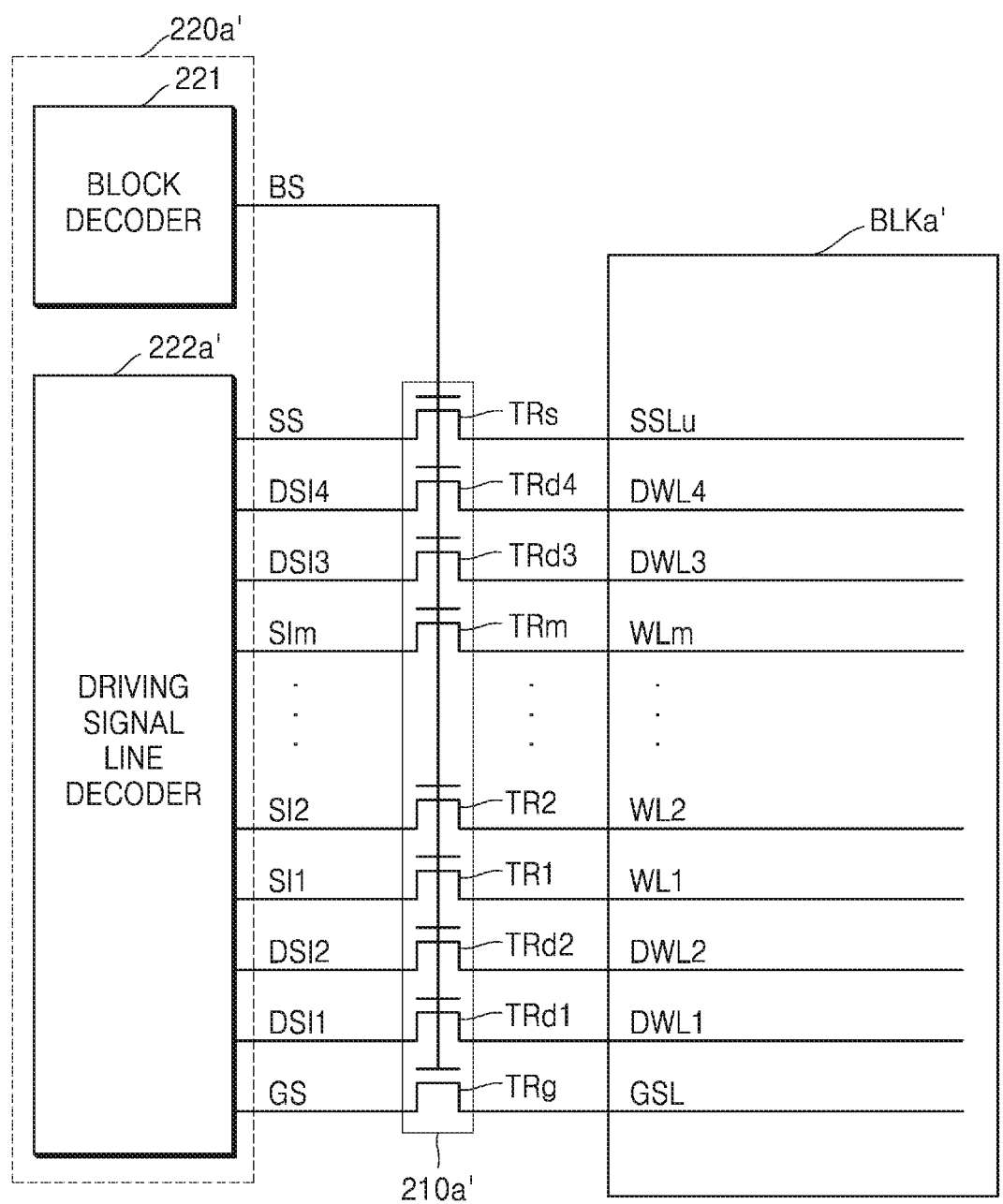
FIG. 11 is a diagram illustrating a row decoder and a pass transistor circuit, according to some example embodiments.

FIG. 11 is a diagram illustrating a row decoder 220a' and a pass transistor circuit 210a', according to some example embodiments.

Referring to FIG. 11, a memory block BLKa' may correspond to one of the memory blocks BLK1 through BLKi of FIG. 3. The memory block BLKa' may further include first through fourth dummy word lines DWL1 through DWL4 as compared to the memory block BLKa in FIG. 5. The first and second dummy word lines DWL1 and DWL2 may be between the ground selection line GSL and the first word line WL1, and the third and fourth dummy word lines DWL3 and DWL4 may be between the m-th word line WLm and the string selection line SSLu. In some example embodiments, the memory block BLKa' may include at least one selected from the first through fourth dummy word lines DWL1 through DWL4. The number of dummy word lines of the memory block BLKa' may vary.

The row decoder 220a' may be a modification of the row decoder 220a in FIG. 5, and the pass transistor circuit 210a' may be a modification of the pass transistor circuit 210a in FIG. 5. The pass transistor circuit 210a' may further include pass transistors TRd1 through TRd4 as compared to the pass transistor circuit 210a in FIG. 5. The pass transistors TRd1 through TRd4 may respectively connect the first through fourth dummy word lines DWL1 through DWL4 to first through fourth dummy word line driving signal lines DSI1 through DSI4, respectively.

Figure 12:
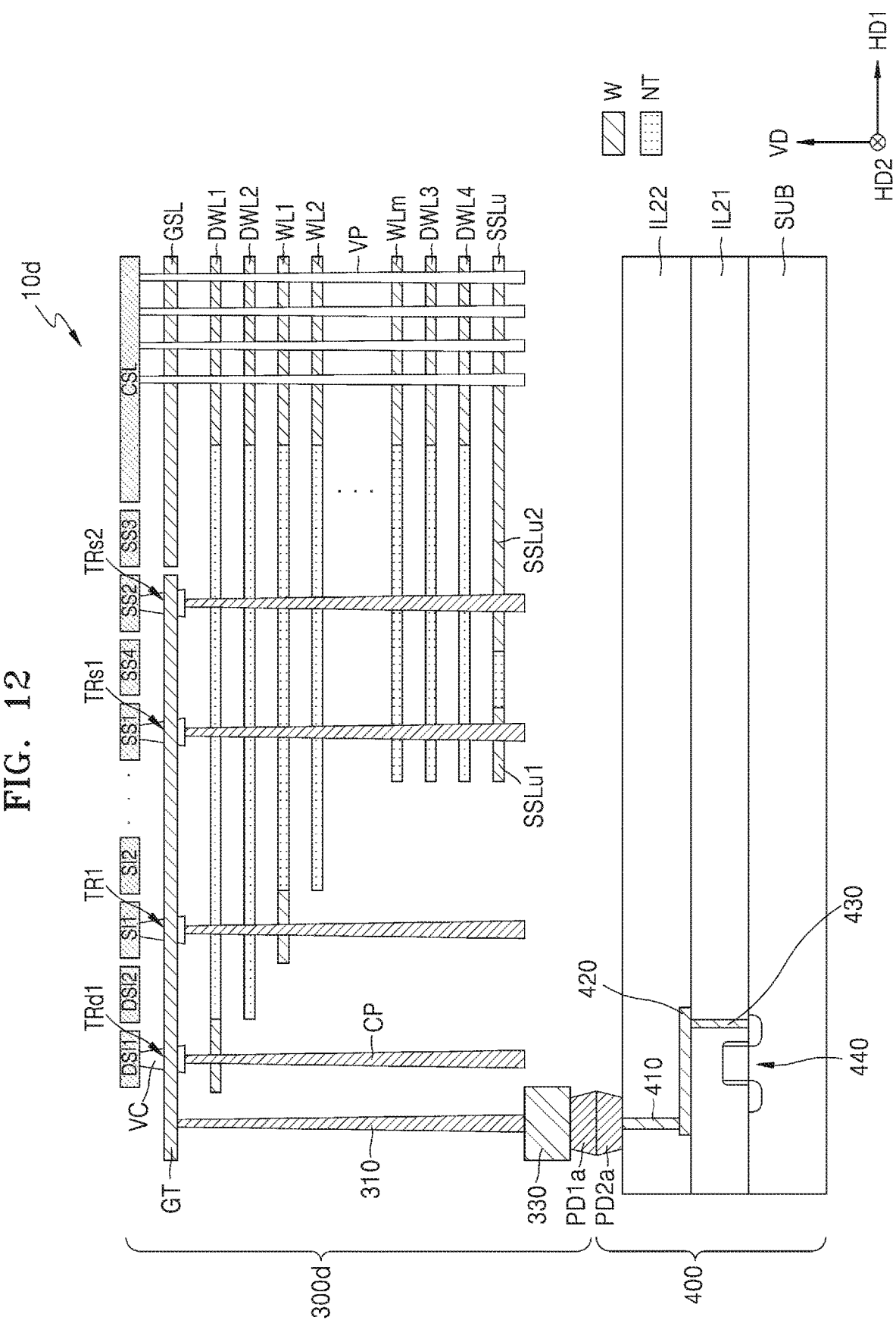
FIG. 12 is a diagram of a memory device including the pass transistor circuit in FIG. 11, according to some example embodiments.

FIG. 12 is a diagram of a memory device 10d including the pass transistor circuit 210a' in FIG. 11, according to some example embodiments. Redundant descriptions of like numerals in FIGS. 8 and 12 will be omitted.

Referring to FIG. 12, a first semiconductor layer 300d of the memory device 10d may include the first through m-th word lines WL1 through WLm and the first through fourth dummy word lines DWL1 through DWL4. The first and second dummy word lines DWL1 and DWL2 may be between the ground selection line GSL and the first word line WL1, and the third and fourth dummy word lines DWL3 and DWL4 may be between the m-th word line WLm and the string selection lines SSLu. However, the memory device 10d is not limited thereto, and the number of dummy word lines may vary.

Each of the first through fourth dummy word lines DWL1 through DWL4 may be connected to a vertical channel VC corresponding thereto through a contact CP corresponding thereto. For example, the vertical channel VC corresponding to the first dummy word line DWL1 may be connected to the first dummy word line driving signal line DSI1. The vertical channel VC connected to the first dummy word line driving signal line DSI1 and the gate GT may form the pass transistor TRd1 connected to the first dummy word line DWL1. In some example embodiments, a plurality of vertical pass transistors (e.g., TRd1, TR1, TRs1, and TRs2) may be connected in common to the gate GT.

Figure 13:
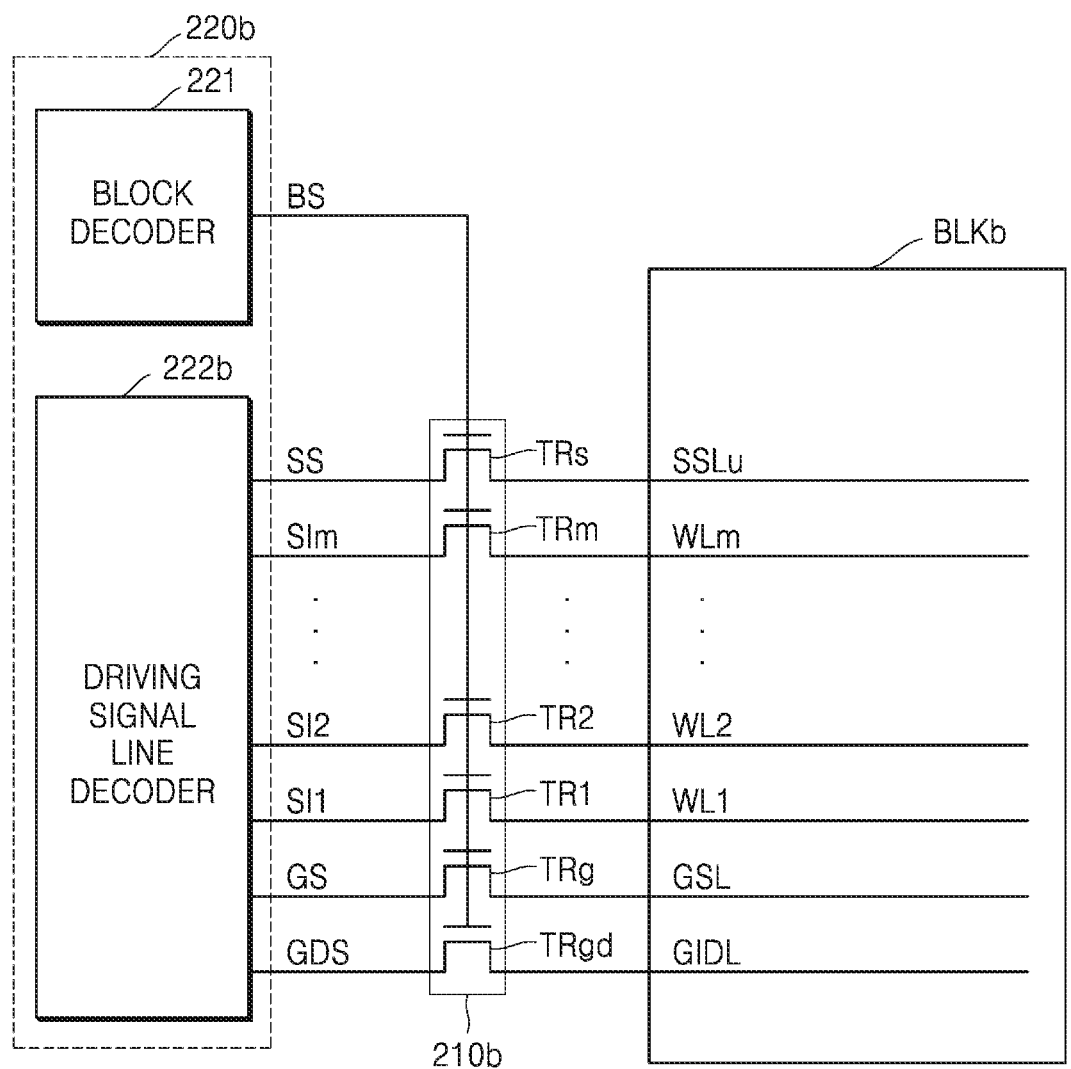
FIG. 13 is a diagram illustrating a row decoder and a pass transistor circuit, according to some example embodiments.

FIG. 13 is a diagram illustrating a row decoder 220b and a pass transistor circuit 210b, according to some example embodiments.

Referring to FIG. 13, a memory block BLKb may correspond to one of the memory blocks BLK1 through BLKi of FIG. 3, where "b" may be a positive integer. The row decoder 220b may be a modification of the row decoder 220a in FIG. 5, and the pass transistor circuit 210b may be a modification of the pass transistor circuit 210a in FIG. 5.

The row decoder 220b may include the block decoder 221 and a driving signal line decoder 222b. The pass transistor circuit 210b may include a plurality of pass transistors, e.g., the pass transistor TRs, the first through m-th pass transistors TR1 through TRm, the pass transistor TRg, and a pass transistor TRgd.

The driving signal line decoder 222b may be connected to the pass transistor circuit 210b through the string selection line driving signal line SS, the first through m-th word line driving signal lines SI1 through SIm, the ground selection line driving signal line GS, and a gate induced drain leakage (GIDL) gate driving signal line GDS. In detail, the string selection line driving signal line SS, the first through m-th word line driving signal lines SI1 through SIm, the ground selection line driving signal line GS, and the GIDL gate driving signal line GDS may be respectively connected to respective sources of the pass transistors (e.g., TRs, TR1 through TRm, TRg, and TRgd).

The pass transistor circuit 210b may be connected to the memory block BLKb through the ground selection line GSL, the first through m-th word lines WL1 through WLm, the string selection line SSLu, and a GIDL gate line GIDL. For example, the pass transistor TRgd may connect the GIDL gate line GIDL to the GIDL gate driving signal line GDS. When a block selection signal is activated, the pass transistors (e.g., TRs, TR1 through TRm, TRg, and TRgd) may respectively provide driving signals, which are respectively provided through the string selection line driving signal line SS, the first through m-th word line driving signal lines SI1 through SIm, the ground selection line driving signal line GS, and the GIDL gate driving signal line GDS, to the string selection line SSLu, the first through m-th word lines WL1 through WLm, the ground selection line GSL, and the GIDL gate line GIDL.

In some example embodiments, at least one of the pass transistors TRs and TRg and the first through m-th pass transistors TR1 through TRm may be implemented as vertical pass transistors. For example, the pass transistors TRs and TRg and the first through m-th pass transistors TR1 through TRm may be in a stair area (e.g., SA in FIG. 8). In some example embodiments, the pass transistor TRgd may be implemented as a normal pass transistor. For example, the pass transistor TRgd may be in a second semiconductor layer. This will be described in detail with reference to FIG. 14.

Figure 14:
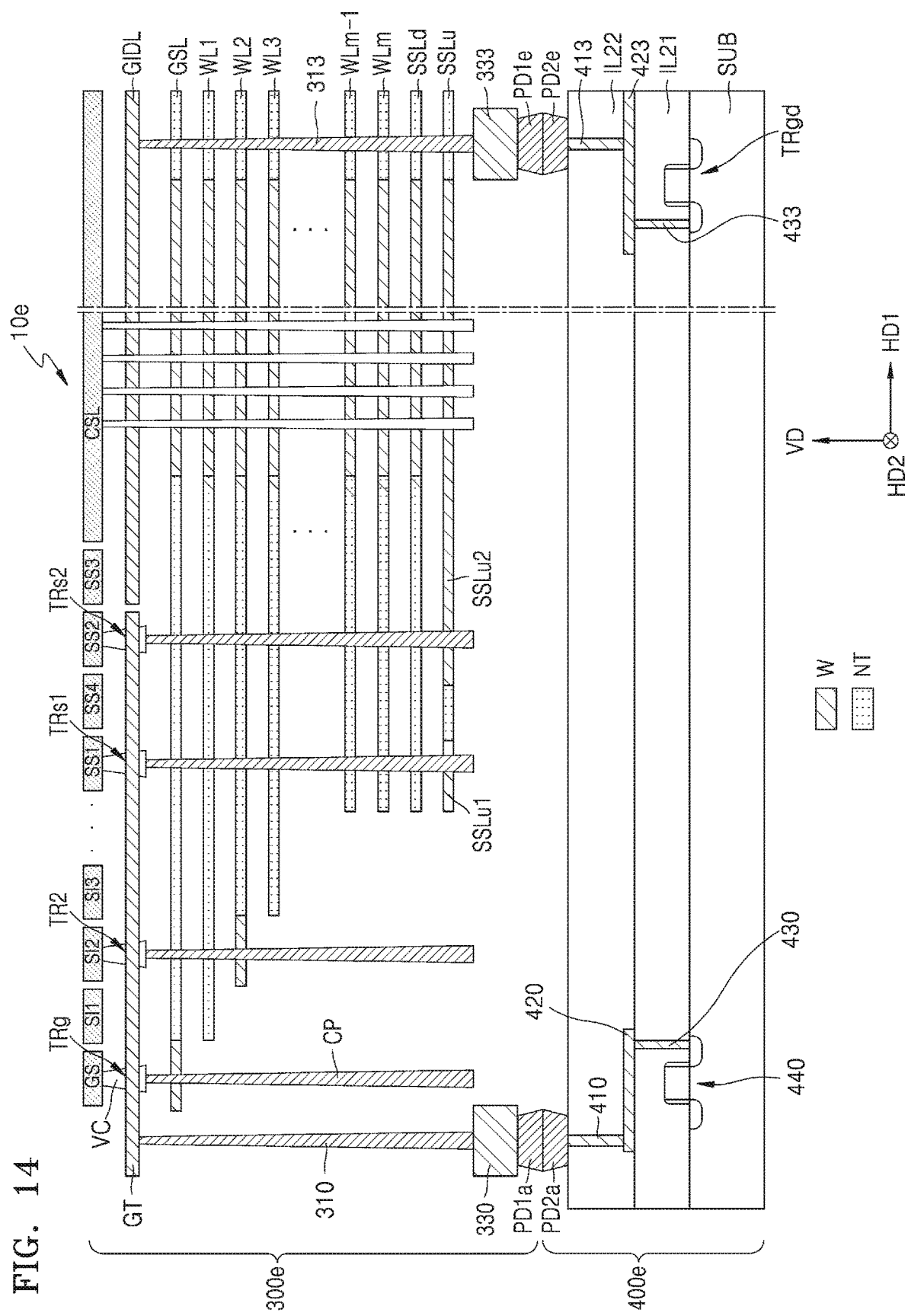
FIG. 14 is a cross-sectional view schematically illustrating a memory device including the pass transistor circuit in FIG. 13, according to some embodiments.

FIG. 14 is a cross-sectional view schematically illustrating a memory device 10e including the pass transistor circuit 210b in FIG. 13, according to some embodiments. Redundant descriptions of like numerals in FIGS. 8 and 14 will be omitted.

Referring to FIG. 14, a first semiconductor layer 300e of the memory device 10e may include the string selection line SSLu, the first through m-th word lines WL1 through WLm, the ground selection line GSL, the GIDL gate line GIDL, and the common source line CSL.

The string selection line SSLu, the first through m-th word lines WL1 through WLm, the ground selection line GSL, and the GIDL gate line GIDL may be sequentially stacked in the vertical direction and may extend in the first horizontal direction HD1. Each of the string selection line SSLu, the first through m-th word lines WL1 through WLm, the ground selection line GSL, and the GIDL gate line GIDL may be electrically insulated by a plurality of insulating layers.

A plurality of vertical pass transistors (e.g., TRg, TR2, TRs1, and TRs2) may be in a stair area (e.g., SA in FIG. 8). The vertical pass transistor TRg may be connected between the ground selection line GSL and the ground selection line driving signal line GS. The second vertical pass transistor TR2 may be connected between the second word line WL2 and the second word line driving signal line S12. The second vertical pass transistor TR2 may be connected to the second word line WL2 through the contact CP corresponding thereto.

The vertical pass transistor TRg may be connected to the ground selection line GSL through the contact CP corresponding thereto. In some example embodiments, different contacts CP respectively connected to different vertical channels VC may have the same height in the vertical direction VD.

The vertical channels VC of the respective vertical pass transistors (e.g., TRg, TR2, TRs1, and TRs2) may be connected in common to the gate GT. In some example embodiments, the gate GT connected in common to the vertical channels VC of the respective vertical pass transistors (e.g., TRg, TR2, TRs1, and TRs2) may be at the same level as the GIDLgate line GIDL. In some example embodiments, the vertical channels VC may have the same height in the vertical direction VD.

In some example embodiments, a first length of the gate GT in the vertical direction VD may be substantially the same as a third length of the GIDL gate line GIDL in the vertical direction VD. In some example embodiments, the first length of the gate GT may be different from the third length of the GIDL gate line GIDL. For example, the first length may be greater than the third length.

In the memory device 10e, some of a plurality of pass transistors (e.g., TRs, TR1 through TRm, TRg, and TRgd in FIG. 13) may be formed as vertical pass transistors in the first semiconductor layer 300e, and the others of the pass transistors may be formed as normal pass transistors in a second semiconductor layer 400e. For example, the pass transistor TRgd connected to the GIDL gate line GIDL, which is in the same layer as the gate GT among the GIDL gate line GIDL, the ground selection line GSL, the first through m-th word lines WL1 through WLm, the upper string selection line SSLd, and the lower string selection lines SSLu, may be formed as a normal pass transistor in the second semiconductor layer 400e. The GIDL gate line GIDL may be connected to the pass transistor TRgd through an interconnection, which includes a fourth contact 313, a metal pattern 333, and a bonding pad PD1e that are included in the first semiconductor layer 300e and a bonding pad PD2e, contacts 413 and 433, and a metal pattern 423 that are included in the second semiconductor layer 400e.

The fourth contact 313 may extend in the vertical direction VD to be in contact with the GIDL gate line GIDL and may penetrate through the ground selection line GSL, the first through m-th word lines WL1 through WLm, the upper string selection line SSLd, and the lower string selection lines SSLu. The ground selection line GSL, the first through m-th word lines WL1 through WLm, the upper string selection line SSLd, and the lower string selection lines SSLu may include the insulating region NT contacting the fourth contact 313.

In the memory device 10e, the gate GT connected in common to a plurality of vertical pass transistors (e.g., TRg, TR2, TRs1, and TRs2) is at the same level as the GIDL gate line GIDL, and therefore, the pass transistor TRgd connected to the GIDL gate line GIDL may be formed in the second semiconductor layer 400e. However, embodiments are not limited thereto. The pass transistor TRgd connected to the GIDL gate line GIDL may be formed in the first semiconductor layer 300e as a normal transistor or a vertical pass transistor.

Although it is illustrated in FIG. 14 that only the pass transistor TRgd among a plurality of pass transistors is located in the second semiconductor layer 400e, the memory device 10e is not limited thereto. Two or more pass transistors may be in the second semiconductor layer 400e. For example, when a length of the gate GT in the vertical direction VD is greater than a length of the GIDL gate line GIDL in the vertical direction VD, the pass transistors TRgd and TRg may be in the second semiconductor layer 400e.

Figure 15:
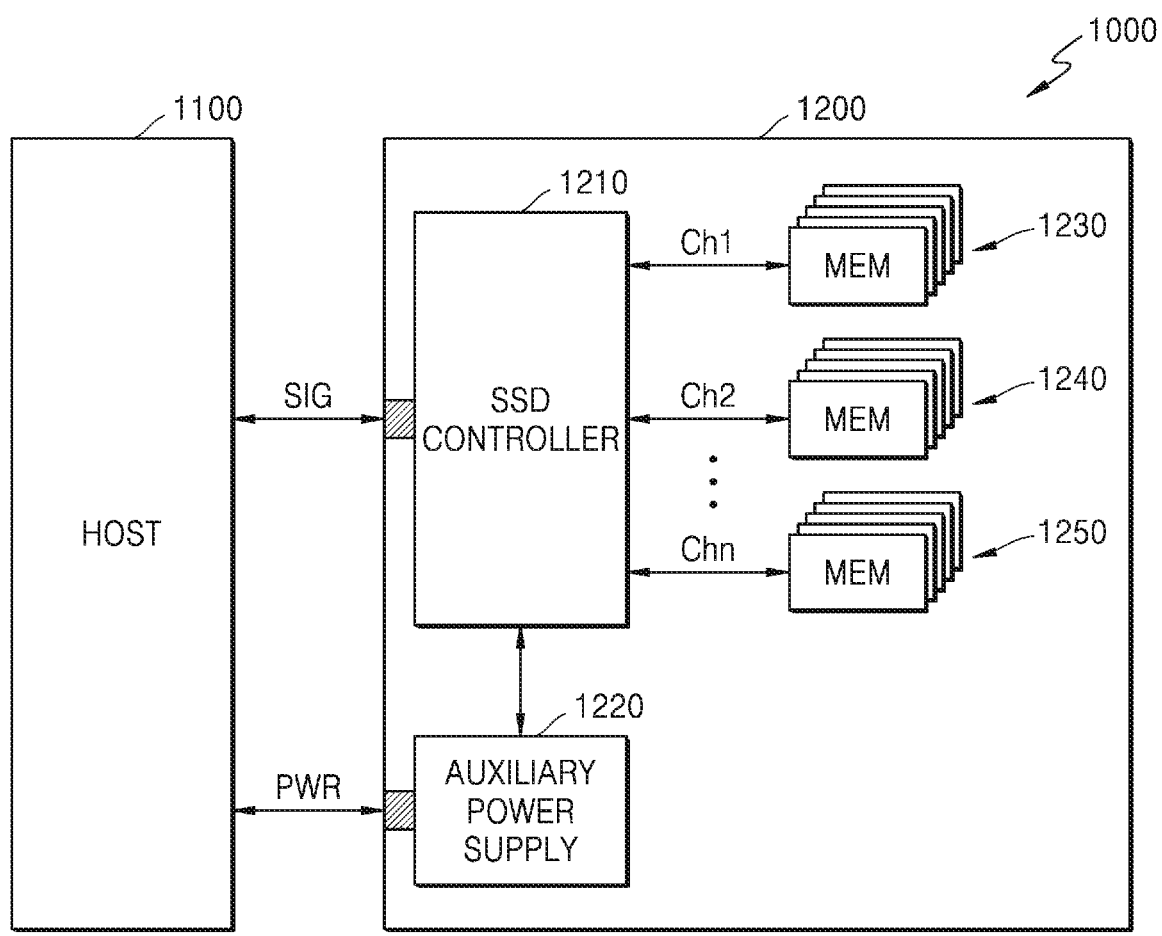
FIG. 15 is a block diagram of an example in which a memory device according to some example embodiments is applied to a solid state drive (SSD) system, according to some example embodiments.

FIG. 15 is a block diagram of an example in which a memory device according to example embodiments is applied to a solid state drive (SSD) system 1000. Referring to FIG. 15, the SSD system 1000 may include a host 1100 and an SSD 1200. The SSD 1200 may exchange signals with the host 1100 through a signal connector SIG and may receive electric power through a power connector PWR. The SSD 1200 may include an SSD controller 1210, an auxiliary power supply 1220, and memory devices 1230, 1240, and 1250. Each of the memory devices 1230, 1240, 1250 may include a plurality of memory chips MEM, and the memory devices 1230, 1240, 1250 may be connected to the SSD controller 1210 through channels Ch1~Chn.

The memory devices 1230, 1240, and 1250 may be implemented using any of the embodiments of a memory device that has been described with reference to FIGS. 1 through 14.

Figure 16:
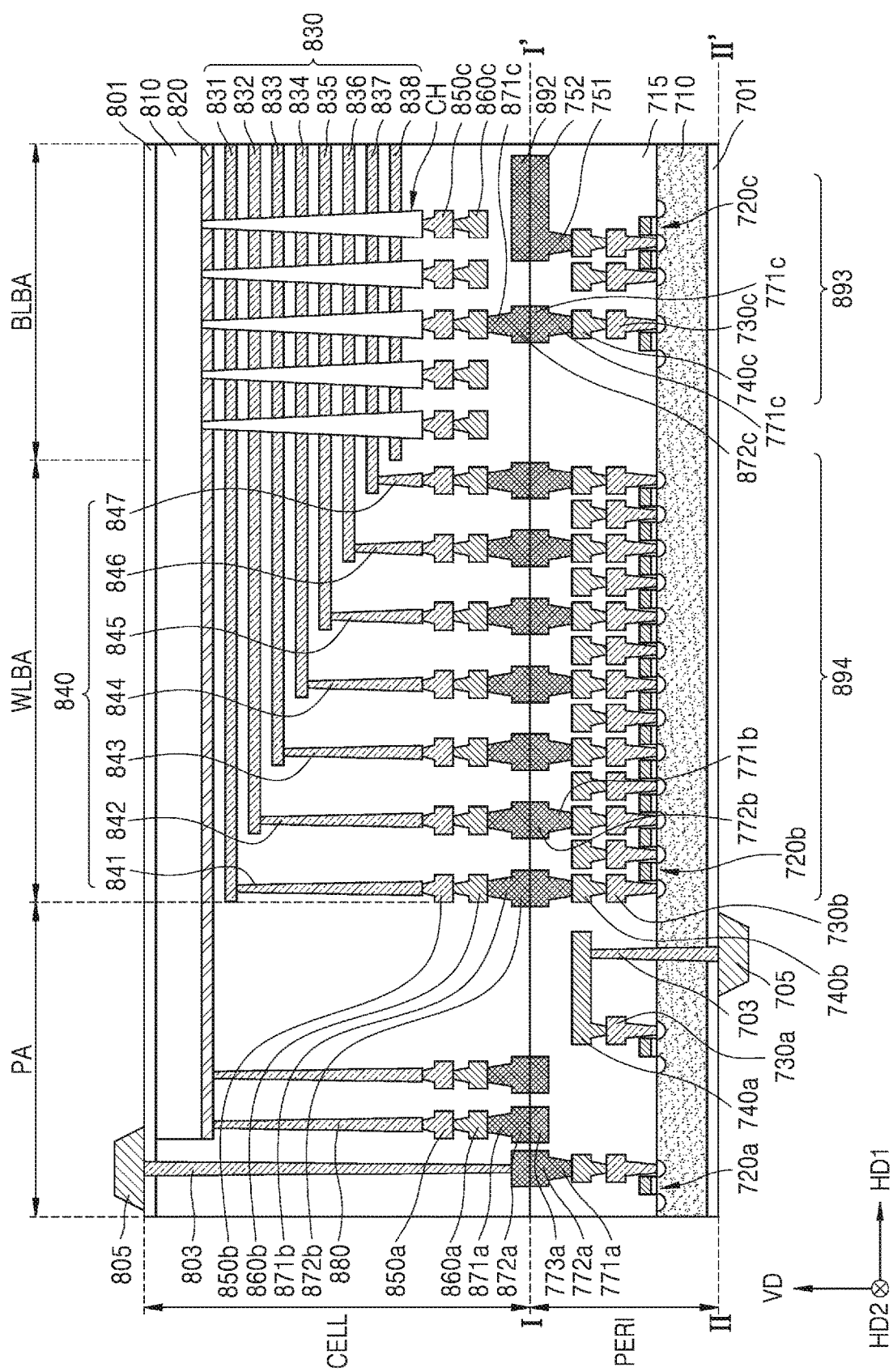
FIG. 16 illustrates a memory device 900 having a chip-to-chip structure, according to example embodiments of the inventive concept.

FIG. 16 illustrates a memory device 900 having a chip-to-chip structure, according to example embodiments of the inventive concept.

Referring to FIG. 16, a memory device 900 may have a chip-to-chip (C2C) structure. The C2C structure may refer to a structure formed by manufacturing an upper chip including a memory cell region CELL on a first wafer (e.g., a first semiconductor layer 300), manufacturing a lower chip including a peripheral circuit region PERI on a second wafer (e.g., a second semiconductor layer 400), different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten. Each memory device of the above embodiments may be implemented as the memory device 900.

Each of the peripheral circuit region PERI and the memory cell region CELL of the memory device 900 may include an external pad bonding area PA, a word line bonding area WLBA, and a bit line bonding area BLBA. The word line bonding area WLBA may be corresponded to the stair area SA of the above embodiments, and the bit line bonding area BLBA may be corresponded to the cell area CA of the above embodiments.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In some embodiments, the first metal layers 730a, 730b, and 730c may be formed of tungsten having relatively high resistance, and the second metal layers 740a, 740b, and 740c may be formed of copper having relatively low resistance.

In some embodiments illustrated in FIG. 16, although the first metal layers 730a, 730b, and 730c and the second metal layers 740a, 740b, and 740c are shown and described, they are not limited thereto, and one or more metal layers may be further formed on the second metal layers 740a, 740b, and 740c. At least a portion of the one or more metal layers formed on the second metal layers 740a, 740b, and 740c may be formed of aluminum or the like having a lower resistance than those of copper forming the second metal layers 740a, 740b, and 740c.

The interlayer insulating layer 715 may be disposed on the first substrate 710 and cover or overlap the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically connected to c in a bonding manner, and the lower bonding metals 771b and 772b and the upper bonding metals 871b and 872b may be formed of aluminum, copper, tungsten, or the like. Further, the upper bonding metals 871b and 872b in the memory cell region CELL may be referred as first metal pads and the lower bonding metals 771b and 772b in the peripheral circuit region PERI may be referred as second metal pads.

The memory cell region CELL may include at least one memory block. The memory cell region CELL may include a second substrate 810 and a common source line 820. On the second substrate 810, a plurality of word lines 831 to 838 (i.e., 830) may be stacked in a vertical direction VD, perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction, perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In some embodiments, the bit line 860c may extend in a second horizontal direction HD2, parallel to the upper surface of the second substrate 810. The channel structure CH may be corresponded to at least one of the plurality of vertical channel structures VP of the above embodiments.

In some embodiments illustrated in FIG. 16, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. For example, the bit line 860c may be connected to upper bonding metals 871c and 872c in the memory cell region CELL, and the upper bonding metals 871c and 872c may be connected to lower bonding metals 771c and 772c connected to the circuit elements 720c of the page buffer 893.

In the word line bonding area WLBA, the plurality of word lines 830 may extend in a first horizontal direction HD1, parallel to the upper surface of the second substrate 810, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the first horizontal direction HD1. A first metal layer 850b and a second metal layer 860b may be connected to an upper portion of the plurality of cell contact plugs 840 connected to the plurality of word lines 830, sequentially. The plurality of cell contact plugs 840 may be connected to the circuit region PERI by the upper bonding metals 871b and 872b of the memory cell region CELL and the lower bonding metals 771b and 772b of the peripheral circuit region PERI in the word line bonding area WLBA.

The plurality of cell contact plugs 840 may be electrically connected to the circuit elements 720b providing a row decoder 894 in the peripheral circuit region PERI. In an example embodiment, operating voltages of the circuit elements 720b providing the row decoder 894 may be different than operating voltages of the circuit elements 720c providing the page buffer 893. For example, operating voltages of the circuit elements 720c providing the page buffer 893 may be greater than operating voltages of the circuit elements 720*b* providing the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850*a* and a second metal layer 860*a* may be stacked on an upper portion of the common source line contact plug 880, sequentially. For example, an area in which the common source line contact plug 880, the first metal layer 850*a*, and the second metal layer 860*a* are disposed may be defined as the external pad bonding area PA.

Input-output pads 705 and 805 may be disposed in the external pad bonding area PA. Referring to FIG. 16, a lower insulating film 701 covering or on a lower surface of the first substrate 710 may be formed below the first substrate 710, and a first input-output pad 705 may be formed on the lower insulating film 701. The first input-output pad 705 may be connected to at least one of the plurality of circuit elements 720*a*, 720*b*, and 720*c* disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710. The first substrate 710 may be corresponded to the substrate SUB of the above embodiments.

Referring to FIG. 16, an upper insulating film 801 covering or on the upper surface of the second substrate 810 may be formed on the second substrate 810, and a second input-output pad 805 may be disposed on the upper insulating layer 801. The second input-output pad 805 may be connected to at least one of the plurality of circuit elements 720*a*, 720*b*, and 720*c* disposed in the peripheral circuit region PERI through a second input-output contact plug 803.

According to some embodiments, the second substrate 810 and the common source line 820 may not be disposed in an area in which the second input-output contact plug 803 is disposed. Also, the second input-output pad 805 may not overlap the word lines 830 in the vertical direction VD. Referring to FIG. 16, the second input-output contact plug 803 may be separated from the second substrate 810 in a direction, parallel to the upper surface of the second substrate 810, and may pass through the interlayer insulating layer 815 of the memory cell region CELL to be connected to the second input-output pad 805.

According to some embodiments, the first input-output pad 705 and the second input-output pad 805 may be selectively formed. For example, the memory device 900 may include only the first input-output pad 705 disposed on the first substrate 710 or the second input-output pad 805 disposed on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA, respectively included in the memory cell region CELL and the peripheral circuit region PERI.

In the external pad bonding area PA, the memory device 900 may include a lower metal pattern 773*a*, corresponding to an upper metal pattern 872*a* formed in an uppermost metal layer of the memory cell region CELL, and having the same shape as the upper metal pattern 872*a* of the memory cell region CELL, in an uppermost metal layer of the peripheral circuit region PERI. In the peripheral circuit region PERI, the lower metal pattern 773*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the memory cell region CELL.

The lower bonding metals 771*b* and 772*b* may be formed on the second metal layer 740*b* in the word line bonding area WLBA. In the word line bonding area WLBA, the lower bonding metals 771*b* and 772*b* of the peripheral circuit region PERI may be electrically connected to the upper bonding metals 871*b* and 872*b* of the memory cell region CELL by a Cu—Cu bonding.

Further, the bit line bonding area BLBA, an upper metal pattern 892, corresponding to a lower metal pattern 752 formed in the uppermost metal layer of the peripheral circuit region PERI, and having the same shape as the lower metal pattern 752 of the peripheral circuit region PERI, may be formed in an uppermost metal layer of the memory cell region CELL. A contact may not be formed on the upper metal pattern 892 formed in the uppermost metal layer of the memory cell region CELL.

In some embodiments, corresponding to a metal pattern formed in an uppermost metal layer in one of the memory cell region CELL and the peripheral circuit region PERI, a reinforcement metal pattern having the same shape as the metal pattern may be formed in an uppermost metal layer in another one of the memory cell region CELL and the peripheral circuit region PERI, and a contact may not be formed on the reinforcement metal pattern.

While the inventive concept has been particularly shown and described with reference to embodiments thereof, it will be understood that various changes in form and details may be made therein without departing from the spirit and scope of the following claims. Elements and/or features of any of the embodiments may be combined without departing from the scope of the present inventive concept.

What is claimed is:

1. A non-volatile memory device comprising:
  a memory cell region comprising a first metal pad and a memory cell array that includes a plurality of memory cells; and
  a peripheral circuit region comprising a second metal pad and vertically connected to the memory cell region by the first metal pad and the second metal pad,
  wherein the memory cell region comprises:
   a stair area and a cell area that comprises the memory cell array formed therein;
   a plurality of word lines stacked in a vertical direction that is perpendicular to the memory cell region;
   a ground selection line in a layer on the plurality of word lines;
   a common source line in a layer on the ground selection line;
   a plurality of vertical pass transistors in the stair area; and
   a plurality of driving signal lines in a same layer as the common source line,
  wherein the plurality of word lines form a stair shape in the stair area, and wherein each of the plurality of vertical pass transistors is connected between a corresponding word line among the plurality of word lines and a corresponding driving signal line among the plurality of driving signal lines.

2. The non-volatile memory device of claim 1,
wherein the common source line comprises a metal plate, and
wherein the plurality of driving signal lines are adjacent to each other in a first horizontal direction that is perpendicular to the vertical direction, extend in a second horizontal direction that is perpendicular to the first horizontal direction, and are in a same layer as the metal plate.

3. The non-volatile memory device of claim 1, wherein each of the plurality of vertical pass transistors comprises a gate which is configured to receive a block selection signal.

4. The non-volatile memory device of claim 3, wherein the gate is in a same layer as the ground selection line.

5. The non-volatile memory device of claim 4, wherein a first length of the gate in the vertical direction is equal to a second length of the ground selection line in the vertical direction.

6. The non-volatile memory device of claim 4, wherein a first length of the gate in the vertical direction is greater than a second length of the ground selection line in the vertical direction.

7. The non-volatile memory device of claim 4, wherein the peripheral circuit region further comprises a normal pass transistor connected to the ground selection line.

8. The non-volatile memory device of claim 3,
wherein the memory cell region further comprises a gate induced drain leakage (GIDL) gate line between the ground selection line and the common source line, and
wherein the gate is in a same layer as the GIDL gate line.

9. The non-volatile memory device of claim 8, wherein the peripheral circuit region further comprises a normal pass transistor connected to the GIDL gate line.

10. The non-volatile memory device of claim 1, wherein the ground selection line comprises a different material than the plurality of word lines.

11. A non-volatile memory device comprising:
a memory cell region comprising a first metal pad and a memory cell array that includes a vertical channel structure; and
a peripheral circuit region comprising a second metal pad and vertically connected to the memory cell region by the first metal pad and the second metal pad,
wherein the memory cell region comprises:
a plurality of word lines stacked in a vertical direction;
a ground selection line in a layer on the plurality of word lines;
a plurality of vertical pass transistors in a stair area of the plurality of word lines, the plurality of vertical pass transistors each comprising a vertical channel extending in the vertical direction; and
a plurality of driving signal lines in a layer on the plurality of vertical pass transistors, and
wherein each of the plurality of vertical pass transistors is connected between a corresponding word line among the plurality of word lines and a corresponding driving signal line among the plurality of driving signal lines.

12. The non-volatile memory device of claim 11,
wherein the vertical channel structure has a first width, and
wherein the vertical channel has a second width that is greater than the first width.

13. The non-volatile memory device of claim 11, wherein heights of vertical channels respectively included in the plurality of vertical pass transistors are substantially equal to each other.

14. The non-volatile memory device of claim 11, wherein a bottom level of the vertical channel is higher than a top level of a topmost word line among the plurality of word lines with respect to the peripheral circuit region.

15. The non-volatile memory device of claim 11, wherein the memory cell region further comprises a dummy word line between the plurality of word lines and the ground selection line.

16. The non-volatile memory device of claim 11,
wherein each of the plurality of vertical pass transistors further comprises a gate that is configured to receive a block selection signal, and
wherein the gate is connected to a transistor in the peripheral circuit region through the first metal pad in the memory cell region and through the second metal pad in the peripheral circuit region.

17. The non-volatile memory device of claim 11,
wherein the memory cell region further comprises a plurality of contacts extending in the vertical direction, and
wherein each of the plurality of vertical pass transistors is connected to the corresponding word line through a corresponding contact among the plurality of contacts.

18. The non-volatile memory device of claim 17, wherein lengths of the plurality of contacts are substantially equal to each other.

19. The non-volatile memory device of claim 17,
wherein each of the plurality of word lines comprises a conductive region and an insulating region, and
wherein each of the plurality of word lines is, in the conductive region, in contact with a corresponding contact among the plurality of contacts and is, in the insulating region, in contact with other contacts than the corresponding contact among the plurality of contacts.

20. A non-volatile memory device comprising:
a memory cell region comprising a first metal pad and a memory cell array that includes a plurality of memory cells; and
a peripheral circuit region comprising a second metal pad and vertically connected to the memory cell region by the first metal pad and the second metal pad,
wherein the peripheral circuit region comprises a transistor,
wherein the memory cell region comprises:
a plurality of word lines stacked in a vertical direction;
a ground selection line on the plurality of word lines;
a common source line on the ground selection line;
a plurality of vertical pass transistors in a stair area of the plurality of word lines, wherein the plurality of vertical pass transistors are respectively connected to the plurality of word lines;
a plurality of first contacts extending in the vertical direction, connecting ones of the plurality of vertical pass transistors to ones of the plurality of word lines, and having substantially equal lengths in the vertical direction; and
a plurality of driving signal lines in a same layer as the common source line,
wherein each of the plurality of vertical pass transistors is connected between a corresponding driving signal line among the plurality of driving signal lines and a corresponding word line among the plurality of word lines and comprises a gate that is configured to receive a block selection signal, and wherein the gate is in a same layer as the ground selection line and is connected to the transistor in the peripheral circuit region through a second contact and a first bonding pad that are formed in the memory cell region and through a second bonding pad and a third contact that are formed in the peripheral circuit region.

* * * * *